(12) United States Patent
Rosenblatt et al.

(10) Patent No.: US 10,505,096 B1
(45) Date of Patent: Dec. 10, 2019

(54) THREE-DIMENSIONAL INTEGRATION FOR QUBITS ON MULTIPLE HEIGHT CRYSTALLINE DIELECTRIC

(71) Applicant: International Business Machines Corporation, Armonk, NY (US)

(72) Inventors: Sami Rosenblatt, White Plains, NY (US); Rasit Onur Topaloglu, Poughkeepsie, NY (US); Markus Brink, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/989,873

(22) Filed: May 25, 2018

(51) Int. Cl.
| | |
|---|---|
| *H01L 39/22* | (2006.01) |
| *H01L 39/24* | (2006.01) |
| *H01L 39/02* | (2006.01) |
| *H01L 23/66* | (2006.01) |
| *G06N 10/00* | (2019.01) |

(52) U.S. Cl.
CPC .......... *H01L 39/223* (2013.01); *G06N 10/00* (2019.01); *H01L 23/66* (2013.01); *H01L 39/025* (2013.01); *H01L 39/2493* (2013.01); *H01L 2223/6627* (2013.01)

(58) Field of Classification Search
CPC .. H01L 39/223; H01L 39/025; H01L 39/2493
See application file for complete search history.

(56) References Cited

U.S. PATENT DOCUMENTS

| | | |
|---|---|---|
| 6,355,501 B1 | 3/2002 | Fung et al. |
| 6,534,381 B2 | 3/2003 | Cheung et al. |
| 9,397,283 B2 | 7/2016 | Abraham et al. |
| (Continued) | | |

FOREIGN PATENT DOCUMENTS

| | | |
|---|---|---|
| WO | 2014/163728 A2 | 10/2014 |
| WO | 2017116442 A1 | 7/2017 |
| (Continued) | | |

OTHER PUBLICATIONS

Mantl, "Compound Formation by Ion Beam Synthesis and a Comparison With Alternative Methods Such as Deposition and Growth or Wafer Bonding," Nuclear Instruments and Methods in Physics Research B 106, 1995, pp. 355-363, Elsevier Science B.V., 9 pages.

(Continued)

*Primary Examiner* — Matthew L Reames
(74) *Attorney, Agent, or Firm* — Amin, Turocy & Watson, LLP

(57) ABSTRACT

Techniques related to a three-dimensional integration for qubits on multiple height crystalline dielectric and method of fabricating the same are provided. A superconductor structure can comprise a first buried layer that can comprise a first patterned superconducting layer of a first wafer bonded to a second patterned superconducting layer of a second wafer. The superconductor structure can also comprise a patterned superconducting film attached to the second wafer. Further, the superconductor structure can comprise a second buried layer that can comprise a third patterned superconducting layer of a third wafer bonded to the patterned superconducting film that can be attached to the second wafer.

25 Claims, 22 Drawing Sheets

(56) References Cited

U.S. PATENT DOCUMENTS

| | | | |
|---|---|---|---|
| 9,412,736 | B2 | 8/2016 | Ding et al. |
| 9,520,547 | B2 | 12/2016 | Abraham et al. |
| 9,524,470 | B1 | 12/2016 | Chow et al. |
| 9,836,699 | B1 | 12/2017 | Rigetti et al. |
| 2008/0032501 | A1 | 2/2008 | Klein et al. |
| 2015/0372217 | A1* | 12/2015 | Schoelkopf, III ...... H01L 39/24 505/413 |
| 2016/0292587 | A1 | 10/2016 | Rigetti et al. |
| 2018/0012932 | A1 | 1/2018 | Oliver et al. |
| 2018/0013052 | A1 | 1/2018 | Oliver et al. |
| 2019/0027672 | A1* | 1/2019 | Megrant ................. H01L 39/02 |

FOREIGN PATENT DOCUMENTS

| | | |
|---|---|---|
| WO | 2017/155531 A1 | 9/2017 |
| WO | 2017/217961 A1 | 12/2017 |
| WO | 2018/030977 A1 | 2/2018 |

OTHER PUBLICATIONS

Brecht et al., "Micromachined Integrated Quantum Circuit Containing a Superconducting Qubit," Physical Review Applied 7, 044018, 2017, American Physical Society, 6 pages.

List of IBM Patents or Applications Treated as Related.

Non-Final Office Action for U.S. Appl. No. 15/989,925 dated Mar. 15, 2019.

International Search Report and Written Opinion received for PCT Application Serial No. PCT/EP2019/062908 dated Aug. 12, 2019, 16 pages.

International Search Report and Written Opinion received for PCT Application Serial No. PCT/EP2019/062976 dated Aug. 9, 2019, 15 pages.

* cited by examiner

THREE-DIMENSIONAL INTEGRATION FOR QUBITS ON MULTIPLE HEIGHT CRYSTALLINE DIELECTRIC

BACKGROUND

The subject embodiments of the invention relate to superconducting devices, and more specifically, to quantum information devices and methods of fabricating the same. For previously proposed vertical Josephson junctions, only a thin silicon layer operates efficiently. However, having a thin silicon increases coupling across circuit layers on opposite sides of the thin silicon layer surfaces. Therefore, both a thin and thick layer silicon should be used. In some cases, there should be both a vertical Josephson junction and a free configuration of interconnections among them.

In addition, when using Silicon-on-Metal (SOM) wafers, it is not possible to remove a bottom superconductor layer while keeping a top superconductor layer. Instead, either both layers are removed, or only the top layer is removed using a standard etch process. If the bottom layer is removed, then filled with dielectric, and a top superconductor layer is deposited, this can increase loss tangent, which is not preferred in quantum computing applications. However, configurations where a bottom superconductor layer is missing and a top superconductor layer exists are utilized for various circuitry.

For example, Megrant (WO Patent Application 2017116442 A1) discusses that "[a] first wafer [ ] and [a] second wafer [ ] are joined (e.g., bonded) together (506), as shown in the example of FIG. 1C to form a wafer stack." See paragraph [0035]. "The second wafer [ ] is prepared in the same manner as the first wafer [ ] and includes a substrate [ ], an insulator layer [ ], a single crystalline dielectric layer [ ], and a superconductor layer [ ]." See id. In Megrant, however, there is no means to access the bottom layer and, therefore, the bottom layer does not comprise circuitry.

SUMMARY

The following presents a summary to provide a basic understanding of one or more embodiments of the invention. This summary is not intended to identify key or critical elements or delineate any scope of the particular embodiments or any scope of the claims. Its sole purpose is to present concepts in a simplified form as a prelude to the more detailed description that is presented later. In one or more embodiments described herein, are systems, computer-implemented methods, methods, apparatuses, devices, and/or computer program products that facilitate three-dimensional integration for qubits on multiple height crystalline.

According to an embodiment, a superconductor structure can comprise a first buried layer that can comprise a first patterned superconducting layer of a first wafer bonded to a second patterned superconducting layer of a second wafer. The superconductor structure can also comprise a patterned superconducting film attached to the second wafer. Further, the superconductor structure can comprise a second buried layer that can comprise a third patterned superconducting layer of a third wafer bonded to the patterned superconducting film that can be attached to the second wafer.

According to an implementation, the first wafer can comprise a first crystalline silicon layer that can be attached to the first patterned superconducting layer. The second wafer can comprise a second crystalline silicon layer that can be attached, at a first side, to the second patterned superconducting layer. Further, the patterned superconducting film can be attached to a second side of the second crystalline silicon layer. The second side can be opposite the first side. In addition, the third wafer can comprise a third crystalline silicon layer that can be attached to the third patterned superconducting layer.

In an example, the first patterned superconducting layer can comprise a first pattern, the second patterned superconducting layer can comprise a second pattern, the third patterned superconducting layer can comprise a third pattern, and the patterned superconducting film can comprise a fourth pattern. Further to the above example, respective pairs of the first pattern, the second pattern, the third pattern, and the fourth pattern can comprise a matching pattern, a non-matching pattern, or combinations thereof.

In accordance with some implementations, the superconductor structure can comprise a through-silicon via located between the first buried layer and the second buried layer. The through-silicon via can be filled with a superconducting metal. According to some implementations, the superconductor structure can comprise one or more microwave circuits selected from a group comprising of a buried coplanar waveguide, a buried microstrip, a microstrip, and a slot line.

The superconductor structure, according to some implementations, can comprise one or more qubits in the second buried layer. At least one qubit of the one or more qubits can comprise a planar Josephson junction and one or more capacitor pads comprising superconducting material. The planar Josephson junction can comprise a first superconductor contact, a tunnel barrier layer, and a second superconductor contact.

According to some implementations, the superconductor structure can comprise one or more qubits. At least one qubit of the one or more qubits can comprise a planar Josephson junction and one or more capacitor pads comprising superconducting material. The planar Josephson junction can comprise a first superconductor contact, a tunnel barrier layer, and a second superconductor contact. Further, the planar Josephson junction can be located over the third crystalline silicon layer. In addition, the one or more capacitor pads can extend from above the third crystalline silicon layer to the second buried layer.

In some implementations, the third patterned superconducting layer can be attached to a first surface of the third crystalline silicon layer. According to these implementations, the superconducting structure can further comprise one or more qubits on a second surface of the third crystalline silicon layer. The second surface can be opposite the first surface. The one or more qubits can comprise a planar Josephson junction and one or more capacitor pads comprising superconducting material. The planar Josephson junction can comprise a first superconductor contact, a tunnel barrier layer, and a second superconductor contact.

According to other implementations, the patterned superconducting film can be a first patterned superconducting film and the third patterned superconducting layer can be attached to a first surface of the third crystalline silicon layer. Further to these implementations, the superconducting structure can further comprise a second patterned superconducting film attached to a second surface of the third crystalline silicon layer. The second surface can be opposite the first surface. A fourth wafer can comprise a fourth crystalline silicon layer that can be attached to a fourth patterned superconducting layer. A third buried layer that can comprise the fourth patterned superconducting layer can be bonded to the second patterned superconducting film that is attached to the third wafer. This process can be applied iteratively to a fifth wafer, a sixth wafer, a seventh wafer, and so on, which can create a corresponding number of four buried layers, five buried layers, six buried layers, and so on, by subsequently bonding two patterned superconducting layers. The buried layers can comprise one or more microwave circuits and zero, one, or multiple qubits.

According to another embodiment, a method can comprise etching a first superconducting layer of a first wafer into a first patterned superconducting layer, a second superconducting layer of a second wafer into a second patterned superconducting layer, and a third superconducting layer of a third wafer into a third patterned superconducting layer. The method can also comprise creating a first buried layer based on a first bonding of the first patterned superconducting layer of the first wafer to the second patterned superconducting layer of the second wafer. Further, the method can comprise creating a second buried layer based on a second bonding of the third patterned superconducting layer of the third wafer to a superconducting film deposited on the second wafer.

Further to the method, the first wafer can comprise a first crystalline silicon layer attached to the first patterned superconducting layer. The second wafer can comprise a second crystalline silicon layer attached, at a first side, to the second patterned superconducting layer. The third wafer can comprise a third crystalline silicon layer attached to the third patterned superconducting layer. In addition, the superconducting film can be attached to a second side of the second crystalline silicon layer. The second side can be opposite the first side.

In some implementations, the method can comprise etching a through-silicon via between the first buried layer and the superconducting film and filling the through-silicon via with a superconducting metal. According to some implementations, the method can comprise forming one or more microwave circuits selected from a group comprising a buried coplanar waveguide, a buried microstrip, a microstrip, and a slot line.

In accordance with some implementations, the method can comprise forming one or more qubits in the second buried layer. At least one qubit of the one or more qubits can comprise a planar Josephson junction and one or more capacitor pads comprising superconducting material. The planar Josephson junction can comprise a first superconductor contact, a tunnel barrier layer, and a second superconductor contact.

The method can comprise, according to some implementations, forming at least one qubit that can comprise a planar Josephson junction and one or more capacitor pads that can comprise superconducting material. The planar Josephson junction can comprise a first superconductor contact, a tunnel barrier layer, and a second superconductor contact. In addition, forming at least one qubit can comprise forming the planar Josephson junction over the third crystalline silicon layer and forming the one or more capacitor pads to extend from above the third crystalline silicon layer to the second buried layer.

In accordance with some implementations, bonding the third patterned superconducting layer can comprise bonding the third patterned superconducting layer to a first surface of the third crystalline silicon layer. Further, the method can comprise forming one or more qubits on a second surface of the third crystalline silicon layer. The second surface can be opposite the first surface. The one or more qubits can comprise a planar Josephson junction and one or more capacitor pads comprising superconducting material. The planar Josephson junction can comprise a first superconductor contact, a tunnel barrier layer, and a second superconductor contact.

According to a further embodiment, a quantum information device can comprise a first buried layer that can comprise a first patterned superconducting layer of a first wafer bonded to a second patterned superconducting layer of a second wafer. The quantum information device can also comprise a patterned superconducting film attached to the second wafer. Further, the quantum information device can comprise a second buried layer that can comprise a third patterned superconducting layer of a third wafer bonded to the patterned superconducting film attached to the second wafer.

Further, in some implementations, the first wafer can comprise a first crystalline silicon layer that can be attached to the first patterned superconducting layer. The second wafer can comprise a second crystalline silicon layer that can be attached, at a first side, to the second patterned superconducting layer. The patterned superconducting film can be attached to a second side of the second crystalline silicon layer. The second side can be opposite the first side. Further, the third wafer can comprise a third crystalline silicon layer that can be attached to the third patterned superconducting layer.

The quantum information device, according to some implementations, can comprise one or more microwave circuits selected from a group comprising a buried coplanar waveguide, a buried microstrip, a microstrip, and a slot line. In some implementations, the quantum information device can comprise a first qubit that can comprise a vertical Josephson junction and a second qubit that can comprise a planar Josephson junction.

According to yet another embodiment, a superconducting device can comprise a first buried layer that can comprise a first patterned superconducting layer of a first wafer bonded to a second patterned superconducting layer attached to a first side of a second wafer. The superconducting device can also comprise a second buried layer comprising a third patterned superconducting layer of a third wafer bonded to a patterned superconducting film attached to a second side of the second wafer. Further, the superconducting device can comprise a qubit in the second buried layer. The qubit can comprise a planar Josephson junction and one or more capacitor pads comprising superconducting material. The planar Josephson junction can comprise a first superconductor contact, a tunnel barrier layer, and a second superconductor contact.

According to still another embodiment, a superconducting device can comprise a first buried layer that can comprise a first patterned superconducting layer of a first wafer bonded to a second patterned superconducting layer attached to a first side of a second wafer. The superconducting device can also comprise a second buried layer that can comprise a third patterned superconducting layer of a third wafer bonded to a patterned superconducting film attached to a second side of the second wafer. Further, the superconducting device can comprise a qubit the can comprise a planar Josephson junction and one or more capacitor pads comprising superconducting material. The planar Josephson junction can comprise a first superconductor contact, a tunnel barrier layer, and a second superconductor contact.

In some implementations, the planar Josephson junction can be located over the third crystalline silicon layer. Further to these implementations, the one or more capacitor pads can extend from above the third crystalline silicon layer to the second buried layer.

Further, in some implementations, the third patterned superconducting layer can be attached to a first surface of the third crystalline silicon layer. The superconducting structure can further comprise one or more qubits on a second surface of the third crystalline silicon layer. The second surface can be opposite the first surface.

DETAILED DESCRIPTION

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

Provided herein is a quantum information device that can comprise one or more superconducting quantum circuits. The one or more superconducting quantum circuits can comprise one or more qubits. In an example, a qubit can be a transmon qubit, a qubit that uses more than one Josephson junction, or another type of qubit. The quantum information device can comprise circuitry located in one or more buried layers. The number of buried layers can equal the number of wafers minus one. Thus, for example, a quantum information device that comprises five wafers has four buried layers. In another example, a quantum information device that comprises twelve wafers has eleven buried layers.

According to some implementations, the quantum information device can comprise circuitry located in one or more buried layers and on a top layer (e.g., two or more layers of circuits). The two or more layers of circuits can be utilized to couple different qubits, provide inputs (e.g., writing to the qubit), and outputs (e.g., reading from the qubit).

Figure 1:
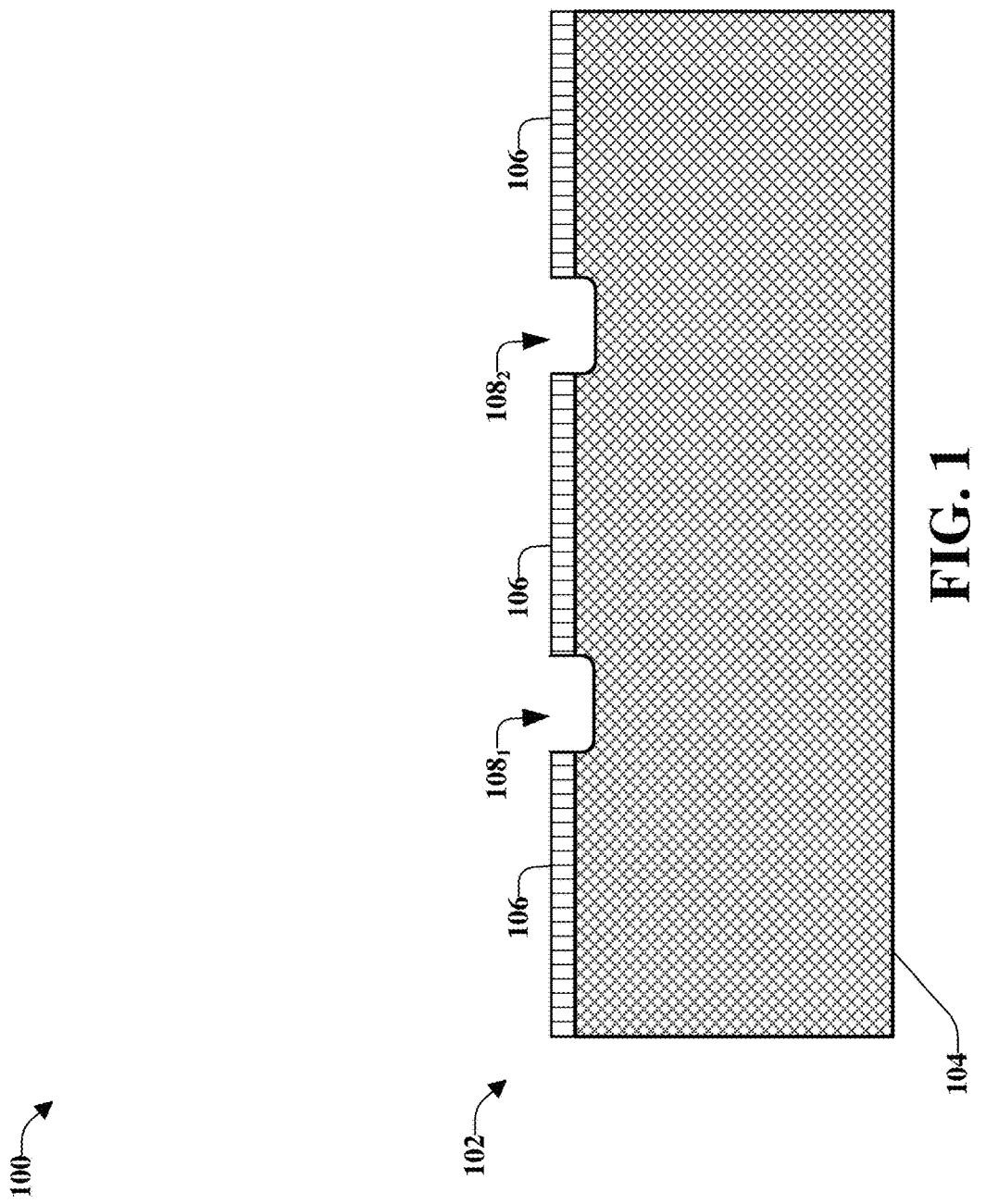
FIG. 1 illustrates an example, non-limiting, side cross-sectional view of a structure for an embodiment of a quantum information device during a fabrication process wherein a first wafer is formed in accordance with one or more embodiments described herein.

FIG. 1 illustrates an example, non-limiting, side cross-sectional view of a structure for an embodiment of a quantum information device 100 during a fabrication process wherein a first wafer 102 is formed in accordance with one or more embodiments described herein.

The first wafer 102 can comprise a first layer of silicon. According to an implementation, the first layer of silicon can be a first crystalline silicon layer 104. The first wafer 102 can also comprise a superconductor (e.g., a superconducting layer) that can be attached to the first crystalline silicon layer 104. The superconductor layer can be deposited (e.g., sputtering, evaporation, Atomic Layer Deposition, electroplating, or another deposition technique) on the first crystalline silicon layer 104.

In an example, the superconductor layer can be patterned (e.g., a first patterned superconducting layer 106). For example, patterning as discussed herein can utilize a subtractive process, such as etching. Patterned portions of the first patterned superconducting layer 106 are represented by etched patterned areas, illustrated as a first patterned area $108_1$ and a second patterned area $108_2$. It is noted that although two patterned areas (e.g., the first patterned area $108_1$ and the second patterned area $108_2$) are illustrated, the disclosed aspects are not limited to this implementation and more than two patterned areas (or a single patterned area) can be utilized with the disclosed aspects. Further, as illustrated, the etched areas can extend, at least partially, into the first crystalline silicon layer 104 due to the etching process.

Figure 2:
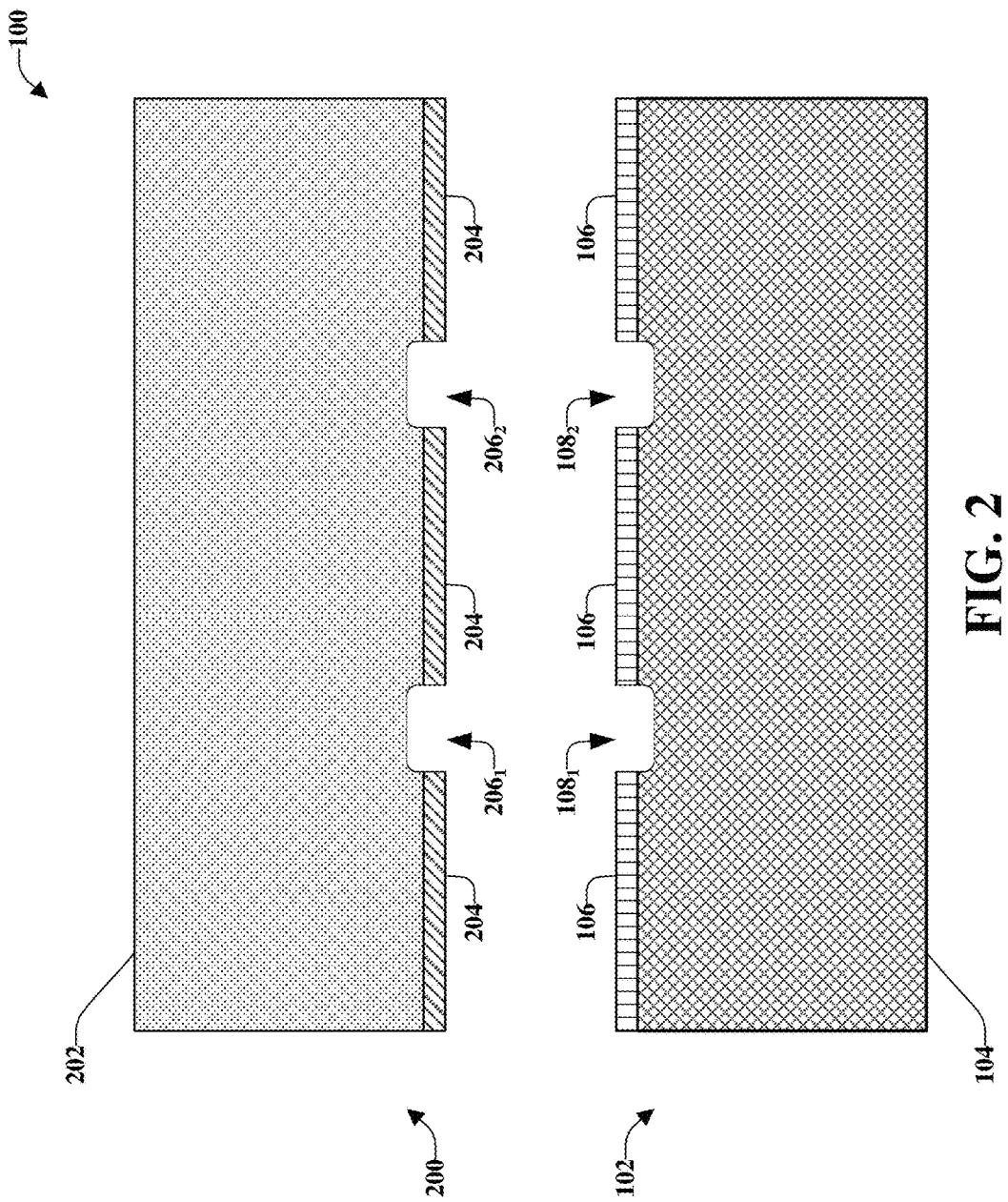
FIG. 2 illustrates an example, non-limiting, side cross-sectional view of the structure of the quantum information device of FIG. 1 during a fabrication process wherein a second wafer is formed in accordance with one or more embodiments described herein.

FIG. 2 illustrates an example, non-limiting, side cross-sectional view of the structure of the quantum information device 100 of FIG. 1 during a fabrication process wherein a second wafer 200 is formed in accordance with one or more embodiments described herein. Repetitive description of like elements employed in other embodiments described herein is omitted for sake of brevity.

Similar to the first wafer 102, the second wafer 200 can comprise a second layer of silicon. According to an implementation, the second layer of silicon can be a second crystalline silicon layer 202. The second wafer 200 can also comprise a superconducting layer that can be patterned (e.g., a second patterned superconducting layer 204). The second crystalline silicon layer 202 can be attached to the second patterned superconducting layer 204. Patterned portions of the second patterned superconducting layer 204 are represented by etched patterned portions, illustrated as a first patterned area $206_1$ and a second patterned area $206_2$. It is noted that although two patterned areas (e.g., the first patterned area $206_1$ and the second patterned area $206_2$) are illustrated, the disclosed aspects are not limited to this implementation and more than two patterned areas (or a single patterned area) can be utilized with the disclosed aspects.

Figure 3:
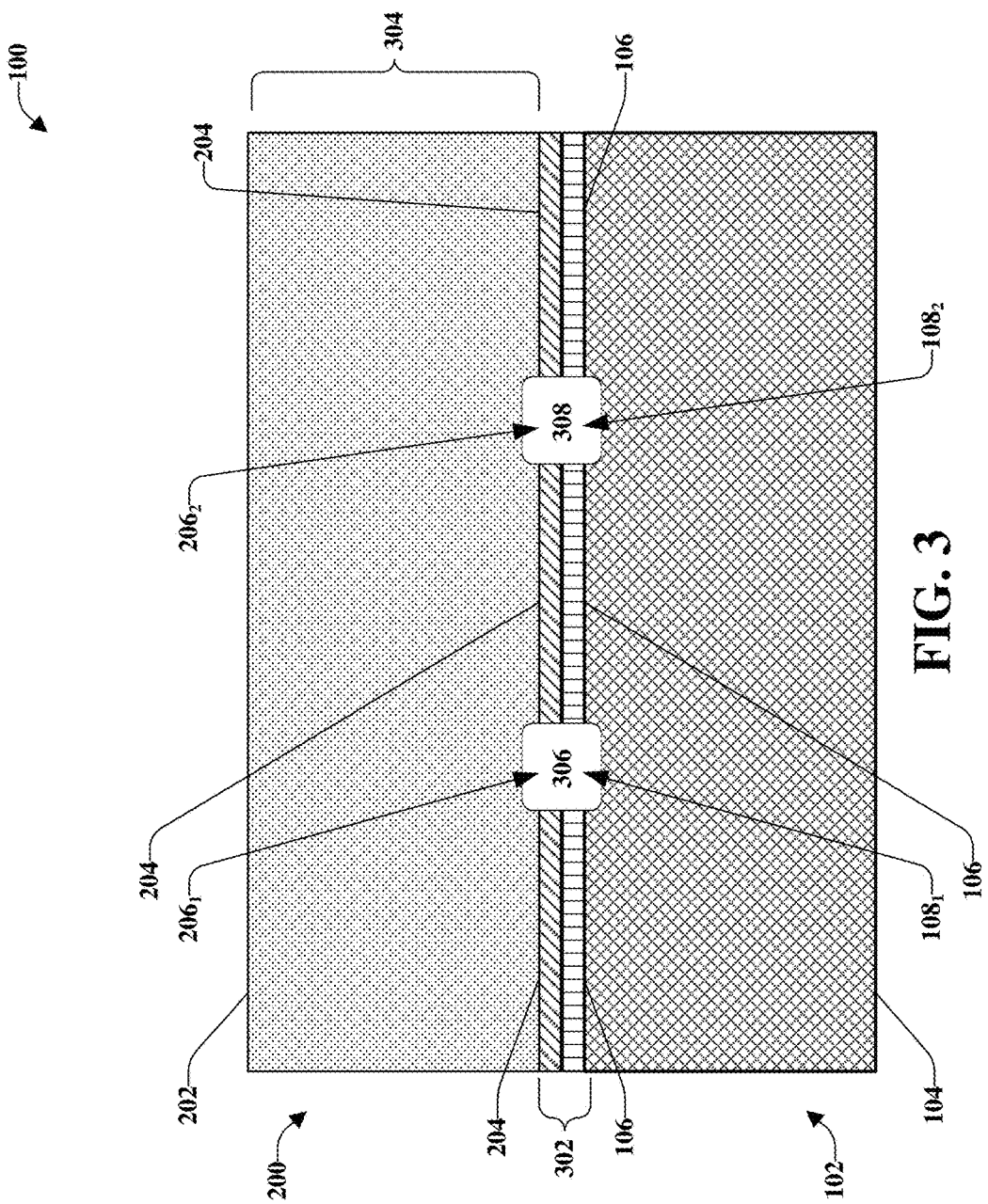
FIG. 3 illustrates an example, non-limiting, side cross-sectional view of a structure for the quantum information device of FIG. 2 during a fabrication process wherein the first wafer is attached to the second wafer in accordance with one or more embodiments described herein.

FIG. 3 illustrates an example, non-limiting, side cross-sectional view of a structure for the quantum information device 100 of FIG. 2 during a fabrication process wherein the first wafer 102 is attached to the second wafer 200 in accordance with one or more embodiments described herein. Repetitive description of like elements employed in other embodiments described herein is omitted for sake of brevity.

To attach (e.g., bond) the first wafer 102 and the second wafer 200, pressure and elevated temperature can be applied. Upon or after the bonding of the wafers (e.g., the first wafer 102 and the second wafer 200), one or more circuits can be defined by the etched portions (e.g., the first patterned area $108_1$, the second patterned area $108_2$, the first patterned area $206_1$, the second patterned area $206_2$). The area of the quantum information device 100 created by the first patterned superconducting layer 106 and the second patterned superconducting layer 204, which includes the one or more circuits, represents a first buried layer 302.

As illustrated, the etched patterned areas of the first wafer 102 (e.g., the first patterned area $108_1$ and the second patterned area $108_2$) and the etched patterned areas of the second wafer 200 (e.g., the first patterned area $206_1$ and the second patterned area $206_2$) can be mirrored patterns. For example, as illustrated, the first patterned area $206_1$ of the second wafer 200 can mirror the first patterned area $108_1$ of the first wafer 102 (as a first buried circuit pattern 306 of the first buried layer 302) and the second patterned area $206_2$ of the second wafer 200 can mirror the second patterned area $108_2$ of the first wafer 102 (as a second buried circuit pattern 308 of the first buried layer 302). Although two buried circuit patterns are illustrated and described, various aspects can utilize a different number of buried circuit patterns.

The disclosed aspects are not limited to mirrored patterns. Instead, less than all of the patterned areas of the first wafer 102 (e.g., the first patterned area $108_1$ and the second patterned area $108_2$) and the patterned areas of the second wafer 200 (e.g., the first patterned area $206_1$ and the second patterned area $206_2$) can be mirrored. Thus, a first set of the patterned areas of both the first wafer 102 and the second wafer 200 can be different, while a second set of the patterned areas of both the first wafer 102 and the second wafer 200 can be mirrored. In some implementations, the patterned areas of the first wafer 102 and the second wafer 200 can be different patterns (e.g., none of the patterned areas of the second wafer 200 mirror the patterned areas of the first wafer 102).

It is noted that as discussed herein the patterned layers (e.g., the first patterned superconducting layer 106 and the second patterned superconducting layer 204) can comprise matching patterns. When the wafers (e.g., the first wafer 102, the second wafer 200) are bonded face-to-face, in order for the patterns to match and form the same circuits, the patterns are mirrored relative to one another (e.g., when looking at the patterned wafer surface). Therefore, the patterned layers match when one wafer (e.g., the first wafer) is flipped upside down and bonded to the other wafer (e.g., the first wafer). Thus, "matching" as used herein means that metal meets metal and non-metal meets non-metal during and after (aligned) bonding.

Conventional techniques for SOM manufacturing do not comprise wafers that are prepatterned, as discussed herein. Instead, to create a circuit in a buried layer using conventional techniques, etching through the entire structure is performed. However, once the entire structure is etched through, some of the properties of the crystalline silicon substrate can be lost. The disclosed aspects can mitigate or eliminate the need to etch through the entire structure through the pre-patterning of the wafers to form the one or more circuits in the buried layer (e.g., the first buried layer 302 and/or other buried layers). Thus, the properties of the crystalline silicon substrate can be retained, which helps preserve long coherence times.

Figure 4:
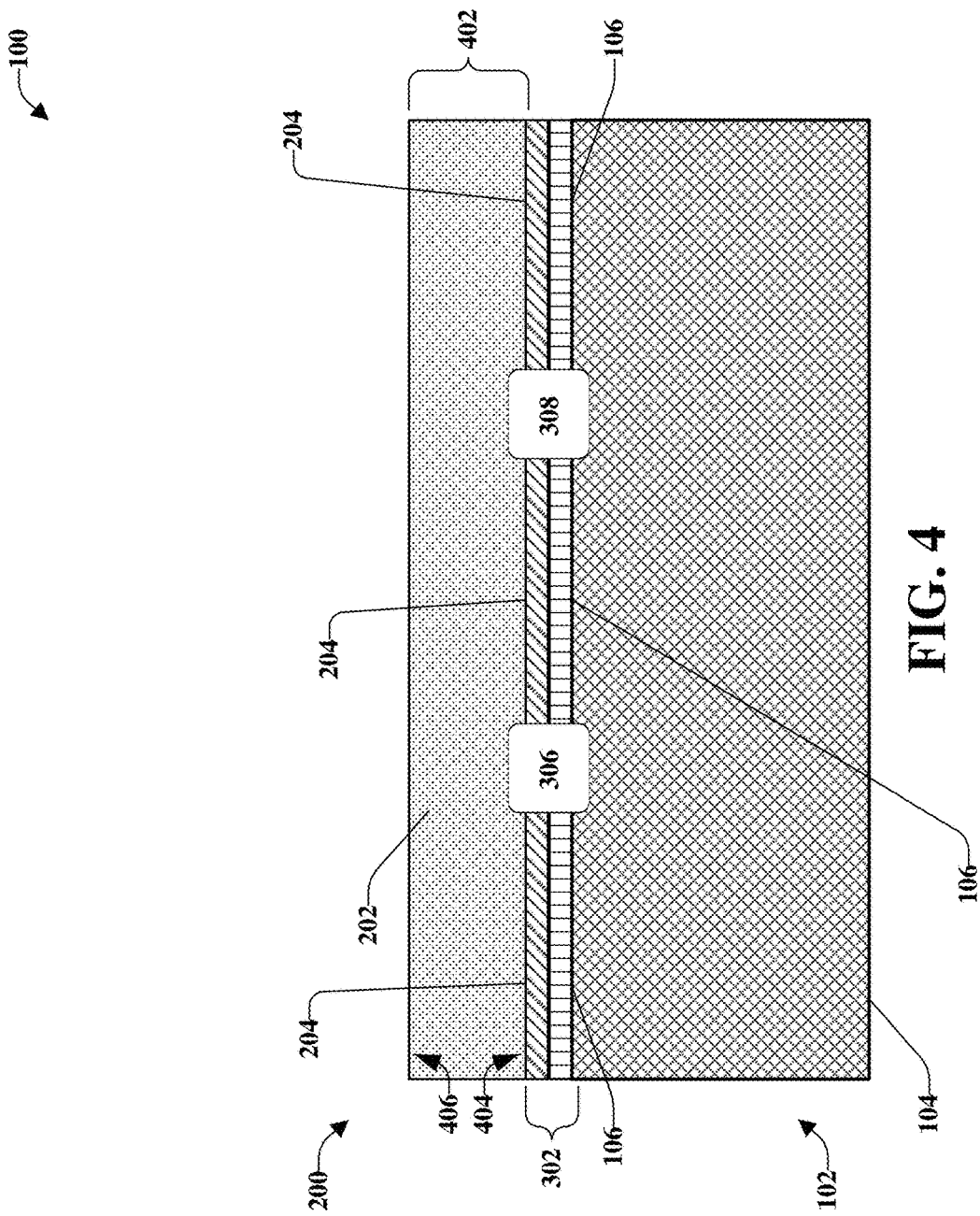
FIG. 4 illustrates an example, non-limiting, side cross-sectional view of the structure of the quantum information device of FIG. 3 during a fabrication process wherein a thickness of the second wafer is reduced in accordance with one or more embodiments described herein.

FIG. 4 illustrates an example, non-limiting, side cross-sectional view of the structure of the quantum information device 100 of FIG. 3 during a fabrication process wherein a thickness of the second wafer 200 is reduced in accordance with one or more embodiments described herein. Repetitive description of like elements employed in other embodiments described herein is omitted for sake of brevity.

The second crystalline silicon layer 202 (which can be referred to as an insulator or top insulator) can be thinned to a defined height. Therefore, upon or after the thinning of the second crystalline silicon layer 202, the first crystalline silicon layer 104 and the second crystalline silicon layer 202 can comprise different heights.

To visualize the thinning of the second crystalline silicon layer 202, refer to FIG. 3 where the second crystalline silicon layer 202 comprises a first height 304. As illustrated in FIG. 4, the second crystalline silicon layer 202 can be thinned or reduced in height to a second height 402.

For purposes of describing the disclosed aspects, the portion of the second crystalline silicon layer 202 to which the second patterned superconducting layer 204 is attached is referred to as a first side 404. Further, a second side 406 of the second wafer 200 is the portion of the second crystalline silicon layer 202 that is opposite the first side 404. To reduce or thin the height of the second crystalline silicon layer 202, a top surface (e.g., the second side 406) of the second crystalline silicon layer 202 can be grinded down and polished.

According to an implementation, the second crystalline silicon layer 202 can be thinned to an example, non-limiting, thickness range (e.g., the second height 402) of between around 100 nms to around 100 ums. However, other thickness ranges can be utilized with the disclosed aspects.

A thicker second crystalline silicon layer can be in the range of between around 1 um to around 100 ums, for example. The thicker second crystalline silicon layer can be intended for applications that utilize less coupling (e.g., weakly coupled) between one or more circuits in a buried layer (e.g., the first buried layer 302) and one or more circuits in a second buried layer (or other buried layers), which will be discussed in further detail with respect to FIG. 10 below. In some implementations, a thicker second crystalline silicon layer can be utilized for embodiments that end with junctions over the second crystalline silicon layer. Accordingly, a thicker second crystalline silicon layer can be utilized for implementations of various quantum circuits.

A thinner second crystalline silicon layer can comprise a thickness range between around 100 nm to around 1 um, for example. The thinner second crystalline silicon layer can be intended for applications that utilize more coupling between one or more circuits in a buried layer (e.g., the first buried layer 302) and one or more circuits in a top layer (e.g., one or more layers over the second side 406 of the second crystalline silicon layer 202).

According to some implementations, a thinner second crystalline silicon layer can be utilized for implementations that utilize a vertical transmon (e.g., a via with a Josephson junction inside the via). A transmon is a specific type of qubit. Accordingly, a thin second crystalline silicon layer can be utilized for implementations of various other quantum circuits. It is noted that although discussed with respect to the thinner second crystalline silicon layer, one or more Josephson junctions can be utilized in the thicker second crystalline silicon layer. However, the functionalities can be different and the circuit designs can be adapted for the intended application.

Figure 5:
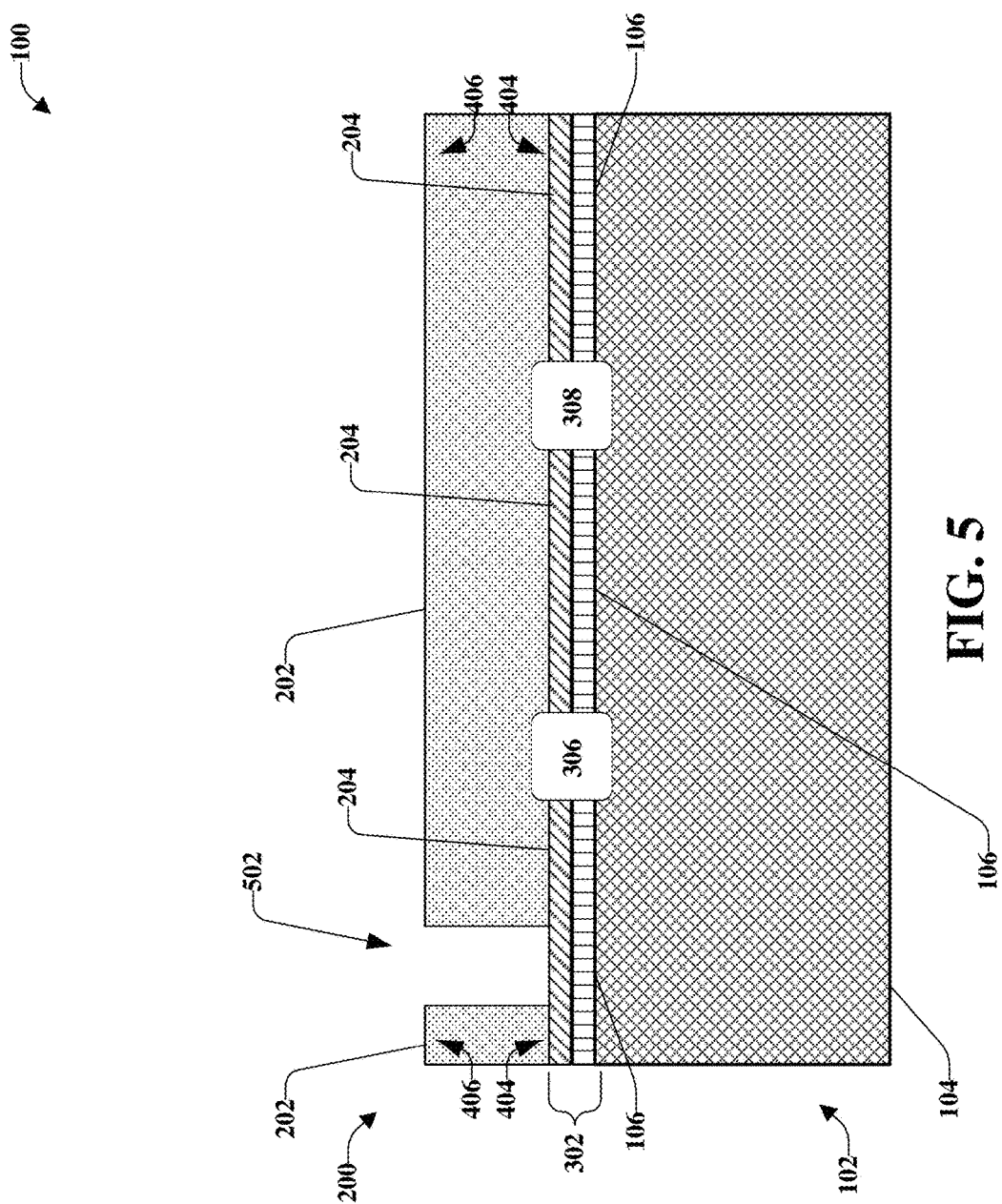
FIG. 5 illustrates an example, non-limiting, side cross-sectional view of the structure of the quantum information device of FIG. 4 during a fabrication process wherein a via is created in the second wafer in accordance with one or more embodiments described herein.

FIG. 5 illustrates an example, non-limiting, side cross-sectional view of the structure of the quantum information device 100 of FIG. 4 during a fabrication process wherein a via is created in the second wafer 200 in accordance with one or more embodiments described herein. Repetitive description of like elements employed in other embodiments described herein is omitted for sake of brevity.

Upon or after the thinning down of the second crystalline silicon layer 202, a via 502 can be etched at one or more defined areas of the second crystalline silicon layer 202. According to some implementations, reactive-ion or Bosch etch can be utilized to etch the via 502. In an example, the via can be a through-silicon via. However, the disclosed aspects are not limited to this type of via and other vias can be utilized. For example, in some implementations one or more partial vias can be utilized at defined locations to capacitively couple the top and bottom substrates. Thus, instead of etching the via 502 all the way through to the first buried layer 302 and filling the etched region with super-conducting material (as will be discussed below with respect to FIG. 6), the via is deep but stops short of connecting all the way to the buried metal (e.g., the first buried layer 302). Accordingly, the via can capacitively couple the circuit(s) on the top layer 406 to the circuit(s) in the first buried layer 302.

Figure 6:
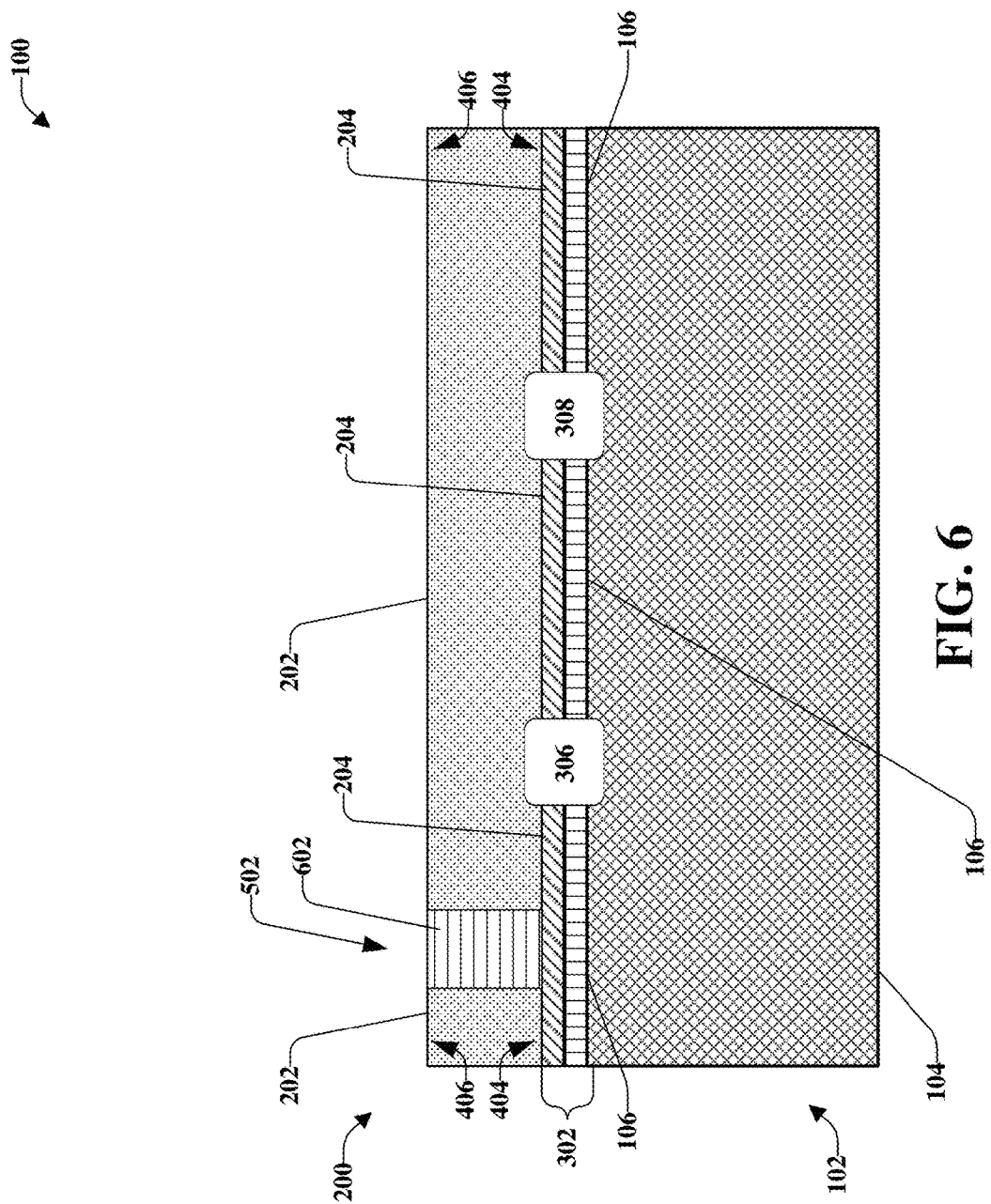
FIG. 6 illustrates an example, non-limiting, side cross-sectional view of the structure of the quantum information device of FIG. 5 during a fabrication process wherein the via is filled in accordance with one or more embodiments described herein.

FIG. 6 illustrates an example, non-limiting, side cross-sectional view of the structure of the quantum information device 100 of FIG. 5 during a fabrication process wherein the via is filled in accordance with one or more embodiments described herein. Repetitive description of like elements employed in other embodiments described herein is omitted for sake of brevity.

Upon or after formation of the via 502, the via can be filled with a superconducting metal 602. In an example, the superconducting metal 602 can be a same or similar super-conducting metal utilized for the first buried layer 302 (e.g., the first patterned superconducting layer 106 and/or the second patterned superconducting layer 204). However, in some implementations, a different superconducting metal can be utilized.

Figure 7:
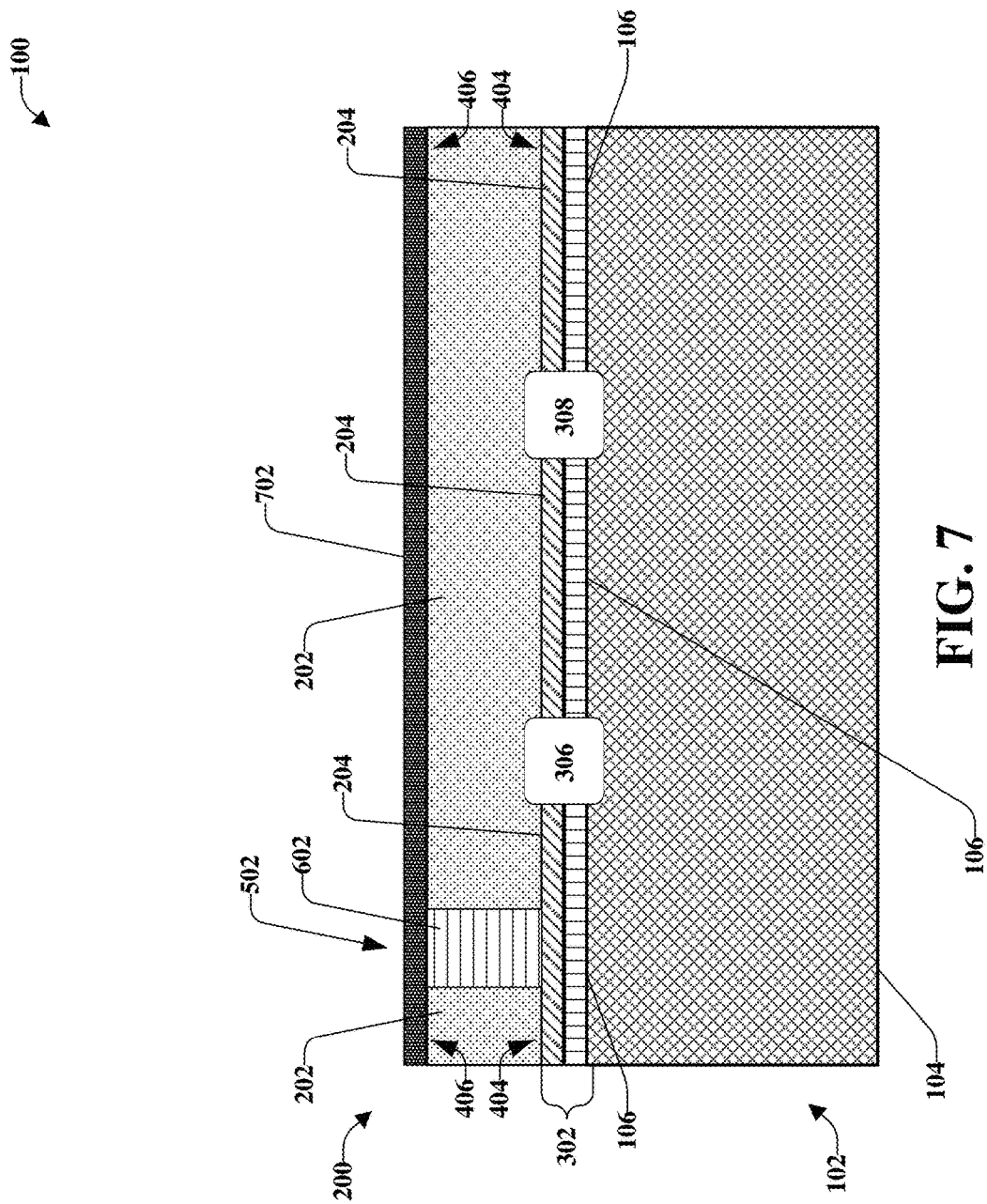
FIG. 7 illustrates an example, non-limiting, side cross-sectional view of the structure of the quantum information device of FIG. 6 during a fabrication process wherein a film is deposited on a top surface of the second wafer in accordance with one or more embodiments described herein.

FIG. 7 illustrates an example, non-limiting, side cross-sectional view of the structure of the quantum information device 100 of FIG. 6 during a fabrication process wherein a film is deposited on a top surface of the second wafer 200 in accordance with one or more embodiments described herein. Repetitive description of like elements employed in other embodiments described herein is omitted for sake of brevity.

As illustrated, a superconducting film 702 (e.g., a thin film) can be deposited on the top surface (e.g., the second side 406) of the second crystalline silicon layer 202. The superconducting film 702 can comprise superconducting material. According to an implementation, the superconducting material for the thin film can be the same or a similar superconducting film utilized for the first buried layer 302 (e.g., the first patterned superconducting layer 106 and/or the second patterned superconducting layer 204) and/or the superconducting metal 602 utilized to fill the via 502. However, according to some implementations, the superconducting material for the superconducting film 702 can be a different superconducting metal than the superconducting metal utilized for the first buried layer 302 (e.g., the first patterned superconducting layer 106 and the second patterned superconducting layer 204) and/or superconducting metal 602 utilized to fill the via 502.

Figure 8:
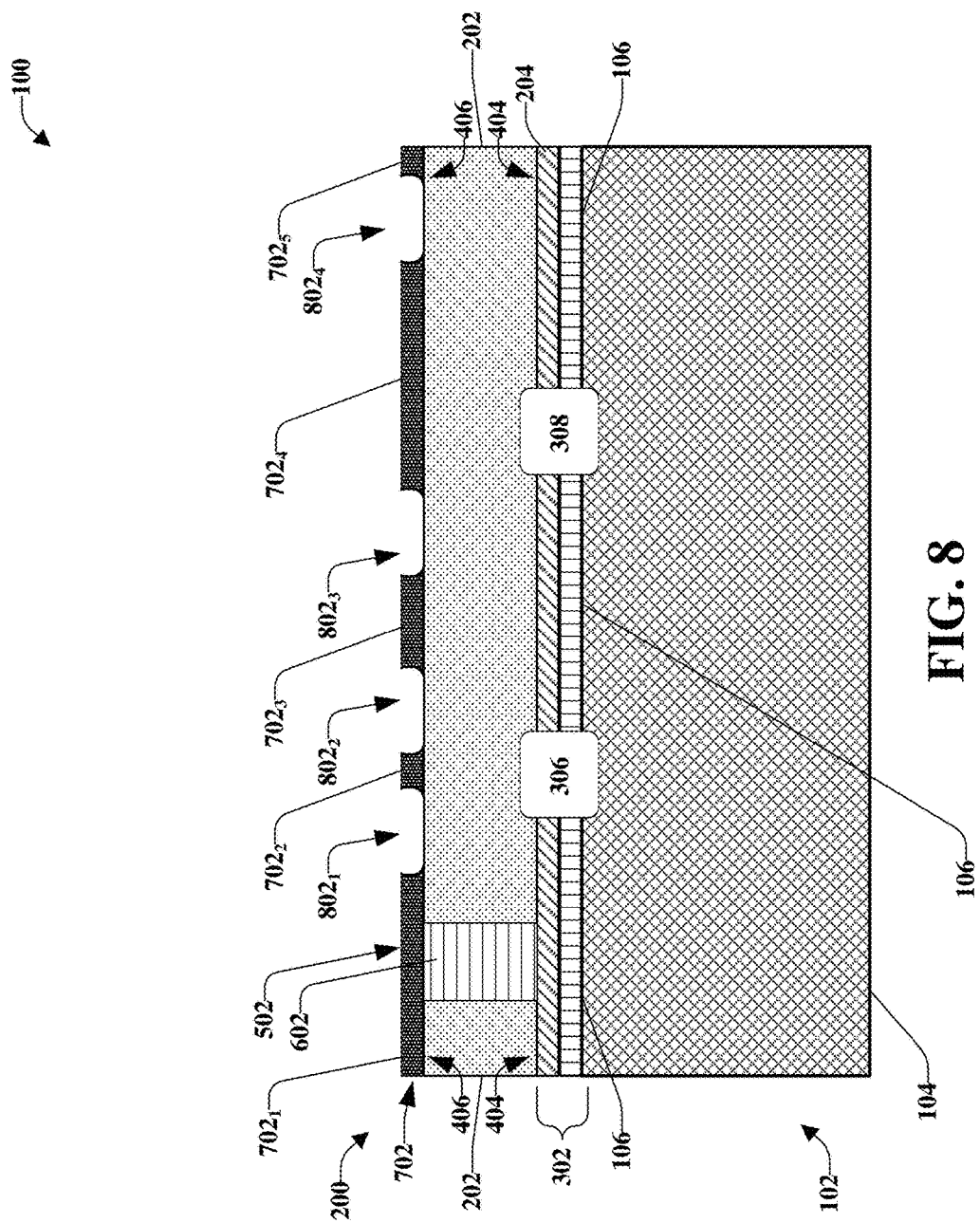
FIG. 8 illustrates an example, non-limiting, side cross-sectional view of the structure of the quantum information device of FIG. 7 during a fabrication process wherein the film deposited on the top surface of the second wafer is patterned in accordance with one or more embodiments described herein.

FIG. 8 illustrates an example, non-limiting, side cross-sectional view of the structure of the quantum information device 100 of FIG. 7 during a fabrication process wherein the film deposited on the top surface of the second wafer 200 is patterned in accordance with one or more embodiments described herein. Repetitive description of like elements employed in other embodiments described herein is omitted for sake of brevity.

As illustrated, the superconducting film 702 can be patterned. For example, the pattern can create one or more openings in the superconducting film 702, resulting in one or more sections of superconducting material. For example, there can be a first section of superconducting metal $702_1$, a second section of superconducting metal $702_2$, a third section of superconducting metal $702_3$, a fourth section of superconducting metal $702_4$, and a fifth section of superconducting metal $702_5$. Further to this example, a first etched area $802_1$ is between the first section of superconducting metal $702_1$ and the second section of superconducting metal $702_2$; a second etched area $802_2$ is between the second section of superconducting metal $702_2$ and the third section of superconducting metal $702_3$; a third etched area $802_3$ is between the third section of superconducting metal $702_3$ and the fourth section of superconducting metal $702_4$; and a fourth etched area $802_4$ is between the fourth section of superconducting metal $702_4$ and the fifth section of superconducting metal $702_5$. It is noted that although illustrated and described with respect to five sections of superconducting material (e.g., the first section of superconducting metal $702_1$, the second section of superconducting metal $702_2$, the third section of superconducting metal $702_3$, the fourth section of superconducting metal $702_4$, and the fifth section of superconducting metal $702_5$) and four areas exposing the top surface (e.g., the second side 406) of the second crystalline silicon layer (e.g., the first etched area $802_1$, the second etched area $802_2$, the third etched area $802_3$ and the fourth etched area $802_4$), the disclosed aspects are not limited to this implementation and other numbers of superconducting material and etched areas can be utilized according to various aspects.

In addition, as illustrated the pattern of the superconducting film 702 can be different than the pattern of the first patterned superconducting layer 106 and/or the second patterned superconducting layer 204. However, according to some implementations, one or more of the patterns of the superconducting film 702, the first patterned superconducting layer 106, and the second patterned superconducting layer 204 can be a matching pattern, or a combination of matching patterns and non-matching patterns.

Figure 9:
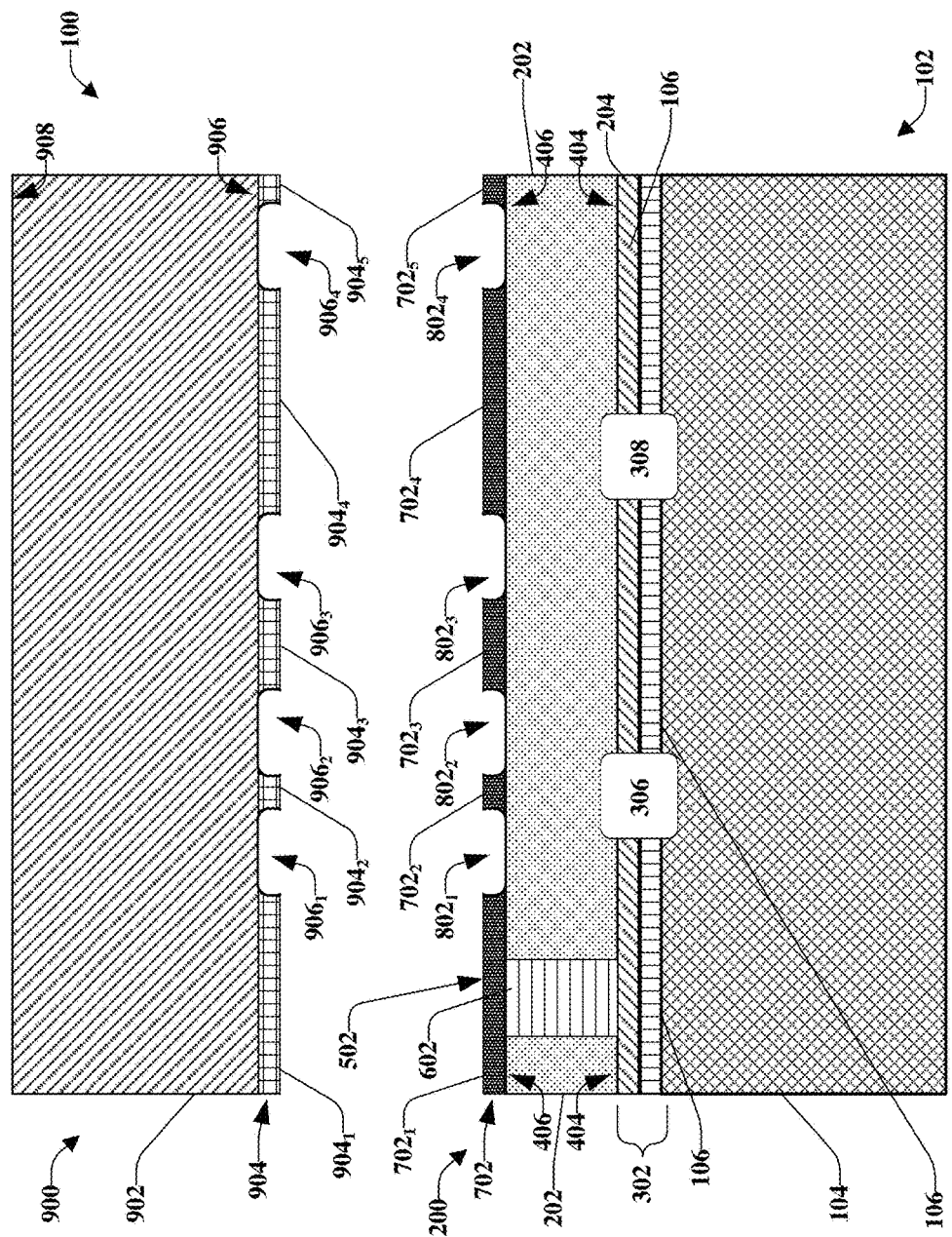
FIG. 9 illustrates an example, non-limiting, side cross-sectional view of the structure of the quantum information device of FIG. 8 during a fabrication process wherein a third wafer is formed in accordance with one or more embodiments described herein.

FIG. 9 illustrates an example, non-limiting, side cross-sectional view of the structure of the quantum information device 100 of FIG. 8 during a fabrication process wherein a third wafer 900 is formed in accordance with one or more embodiments described herein. Repetitive description of like elements employed in other embodiments described herein is omitted for sake of brevity.

Similar to the first wafer 102 and the second wafer 200, the third wafer 900 can comprise a third layer of silicon. According to an implementation, the third layer of silicon can be a third crystalline silicon layer 902. The third wafer 900 can also comprise a superconducting layer that can be patterned (e.g., a third patterned superconducting layer 904). The third crystalline silicon layer 902 can be attached to the third patterned superconducting layer 904 at a first surface 906 of the third crystalline silicon layer 902. A second surface 908 of the third crystalline silicon layer 902 can be opposite the first surface 906. The third patterned superconducting layer 904 can comprise a same superconducting metal, a similar superconducting metal, or a different superconducting metal than the superconducting metals used for the other elements of the quantum information device 100.

Patterned portions of the third patterned superconducting layer 904 can mirror the pattern of the superconducting film 702. However, the disclosed aspects are not limited to this implementation and one or more patterned portions of the third patterned superconducting layer 904 can be similar to, or different from, the patterned portions of the superconducting film 702.

In the illustrated example, the third patterned superconducting layer 904 mirrors the pattern of the superconducting film 702. Therefore, the third patterned superconducting layer 904 can comprise a first section of superconducting metal $904_1$, a second section of superconducting metal $904_2$, a third section of superconducting metal $904_3$, a fourth section of superconducting metal $904_4$, and a fifth section of superconducting metal $904_5$. Further to this example, a first etched area $906_1$ is between the first section of superconducting metal $904_1$ and the second section of superconducting metal $904_2$; a second etched area $906_2$ is between the second section of superconducting metal $904_2$ and the third section of superconducting metal $904_3$, a third etched area $906_3$ is between the third section of superconducting metal $904_3$ and the fourth section of superconducting metal $904_4$, and a fourth etched area $906_4$ is between the fourth section of superconducting metal $904_4$ and the fifth section of superconducting metal $904_5$.

Figure 10:
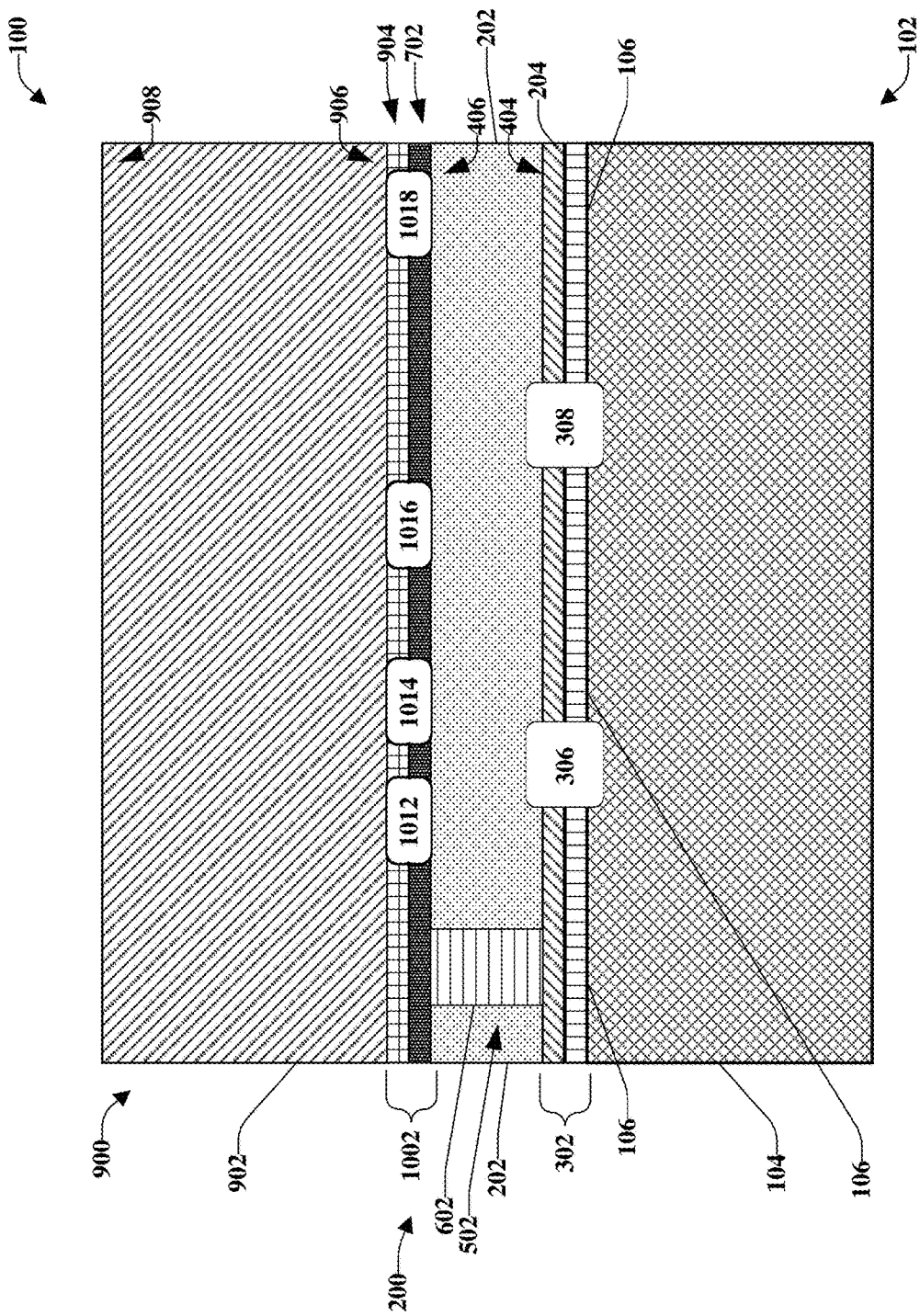
FIG. 10 illustrates an example, non-limiting, side cross-sectional view of the structure of the quantum information device of FIG. 9 during a fabrication process wherein the third wafer is bonded to the second wafer in accordance with one or more embodiments described herein.

FIG. 10 illustrates an example, non-limiting, side cross-sectional view of the structure of the quantum information device 100 of FIG. 9 during a fabrication process wherein the third wafer 900 is bonded to the second wafer 200 in accordance with one or more embodiments described herein. Repetitive description of like elements employed in other embodiments described herein is omitted for sake of brevity.

The third patterned superconducting layer 904 (attached to the first surface 906 of the third crystalline silicon layer 902) can be bonded to the superconducting film 702 attached to the second side 406 of the second wafer 200. According to some implementations, the third patterned superconducting layer 904 can be bonded to the superconducting film 702 through an application of pressure and elevated temperature. The bonding can create a second buried layer 1002.

In the example illustrated, the etched patterned areas of the superconducting film 702 (e.g., the first etched area $802_1$, the second etched area $802_2$, the third etched area $802_3$, and the fourth etched area $802_4$) and the etched patterned areas of the third wafer 900 (e.g., the first etched area $906_1$, the second etched area $906_2$, the third etched area $906_3$, and the fourth etched area $906_4$) can be mirrored patterns.

Thus, in the example illustrated, the first etched area $802_1$ of the superconducting film 702 can mirror the first etched area $906_1$ of the third wafer 900 (as a first buried circuit pattern 1012 of the second buried layer 1002). Further, the second etched area $802_2$ of the superconducting film 702 can mirror the second etched area $906_2$ of the third wafer 900 (as a second buried circuit pattern 1014 of the second buried layer 1002). The third etched area $802_3$ of the superconducting film 702 can mirror the third etched area $906_3$ of the third wafer 900 (as a third buried circuit pattern 1016 of the second buried layer 1002). Further to the illustrated example, the fourth etched area $802_4$ of the superconducting film 702 can mirror the fourth etched area $906_4$ of the third wafer 900 (as a fourth buried circuit pattern 1018 of the second buried layer 1002).

Figure 11:
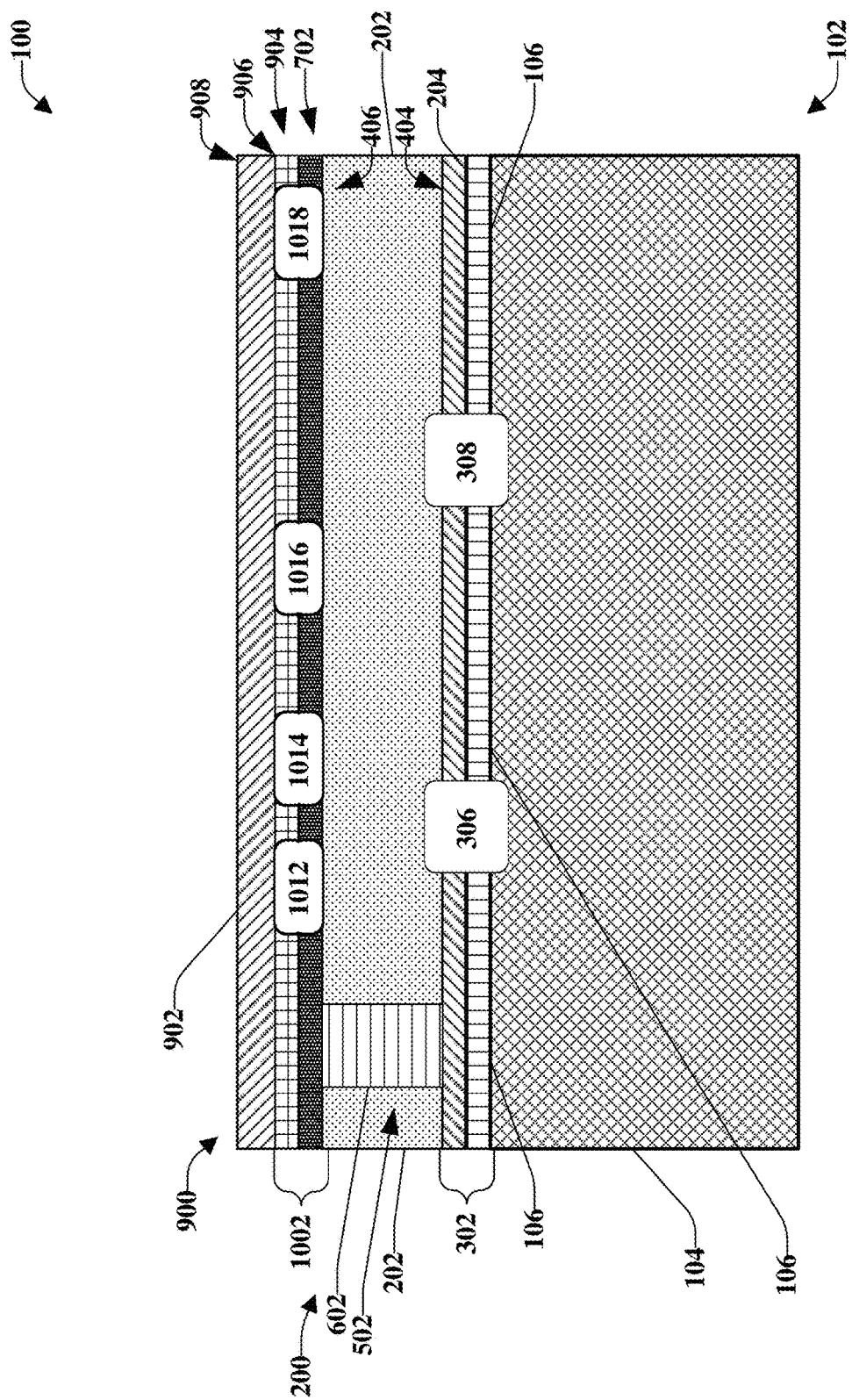
FIG. 11 illustrates an example, non-limiting, side cross-sectional view of the structure of the quantum information device of FIG. 10 during a fabrication process wherein a thickness of the second wafer is reduced in accordance with one or more embodiments described herein.

FIG. 11 illustrates an example, non-limiting, side cross-sectional view of the structure of the quantum information device 100 of FIG. 10 during a fabrication process wherein a thickness of the second wafer 300 is reduced in accordance with one or more embodiments described herein. Repetitive description of like elements employed in other embodiments described herein is omitted for sake of brevity.

The third crystalline silicon layer 902 (which can be referred to as an insulator or top insulator) can be thinned to a defined height. According to some implementations, the defined height of the third crystalline silicon layer 902 can be thinner than the defined height of the second crystalline silicon layer 202, as illustrated. However, the disclosed aspects are not limited to this implementation and the third crystalline silicon layer 902 (and/or subsequent crystalline silicon layers of subsequent wafers) can the same height, a similar height, or a different height than the height of the second crystalline silicon layer 202.

Conventional techniques for SOM manufacturing do not comprise wafers that are prepatterned, as discussed herein. Instead, to create a circuit in a buried layer using conventional techniques, etching through the entire structure is performed. However, once the entire structure is etched through, some of the properties of the crystalline silicon substrate can be lost. The disclosed aspects mitigate or eliminate the need to etch through the entire structure through the pre-patterning of the wafers to form the one or more circuits in the buried layer. Thus, the properties of the crystalline silicon substrate can be retained, which helps preserve long coherence times.

Figure 12:
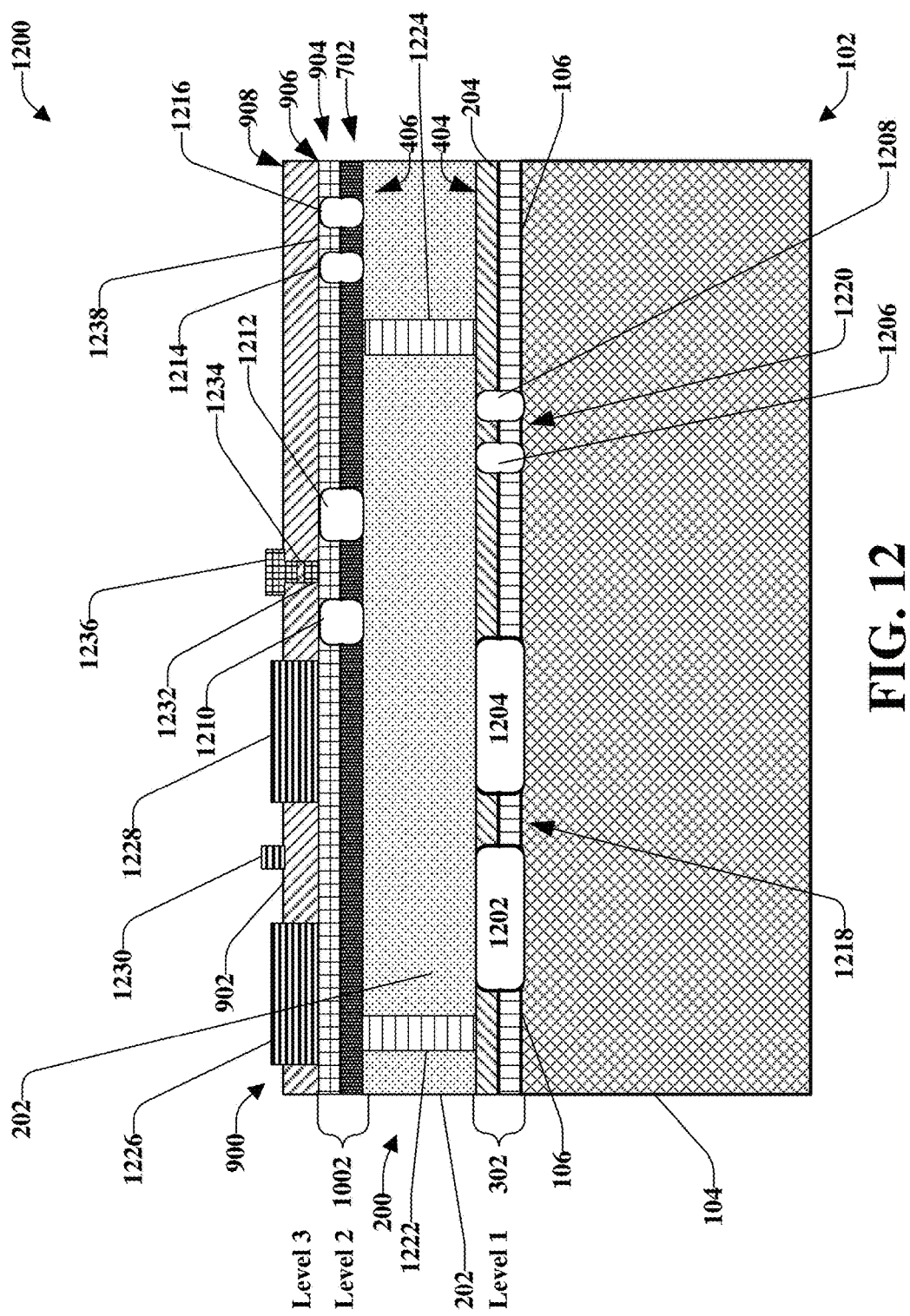
FIG. 12 illustrates an example, non-limiting, side cross-sectional view of a structure for an embodiment of a quantum information device in accordance with one or more embodiments described herein.

FIG. 12 illustrates an example, non-limiting, side cross-sectional view of a structure for an embodiment of a quantum information device 1200 in accordance with one or more embodiments described herein. Repetitive description of like elements employed in other embodiments described herein is omitted for sake of brevity.

The quantum information device 1200 can comprise full planar circuits built into at least three different levels. A first level (Level 1) is represented by the first buried layer 302, a second level (Level 2) is represented by the second buried layer 1002, a third layer (Level 3) is represented by the third wafer 900 (e.g., the third crystalline silicon layer 902). Level 1 can be weakly coupled to the other levels (e.g., Level 2 and Level 3) and can be used for crossovers or readouts. Level 2 and Level 3 can be strongly coupled to each other and can be used for planar Josephson junction transmons, vertical Josephson junction transmons, and/or other circuits. For example, qubits can be formed on a top surface (e.g., over Level 3) and/or within a silicon layer (e.g., the second crystalline silicon layer 202, the second crystalline silicon layer 202).

As illustrated, upon or after bonding the first wafer 102 and the second wafer 200, patterned areas of the first patterned superconducting layer 106 and the second patterned superconducting layer 204 can create, within the first buried layer 302, a first buried circuit pattern area 1202, a second buried circuit pattern area 1204, a third buried circuit pattern area 1206, and a fourth buried circuit pattern area 1208. Further, upon or after bonding the second wafer 200 and the third wafer 900, the superconducting film 702 and the third patterned superconducting layer 904 can create a fifth buried circuit pattern 1210, a sixth buried circuit pattern 1212, a seventh buried circuit pattern 1214, and an eighth buried circuit pattern 1216.

Other circuits and/or electrical elements can be created within one or more buried layers and/or over a top surface of the quantum information device 1200. By way of example and not limitation, the quantum information device 1200 can comprise a buried microstrip 1218 and/or a buried coplanar waveguide (CPW) 1220 in the first buried layer 302 (e.g., Level 1). Further, one or more through-silicon vias can be included in the second crystalline silicon layer 202, illustrated as a first through-silicon via 1222 and a second through-silicon via 1224.

In addition, in the example of FIG. 12, in Level 3 there can be one or more ground isolation moats, illustrated as a first ground isolation moat 1226 and a second ground isolation moat 1228. Also included can be at least one microstrip 1230 between the first ground isolation moat 1226 and the second ground isolation moat 1228. Level 3 can also include one or more qubits, which can be transmon qubits and/or other types of qubits. In an example, a transmon qubit can comprise a vertical Josephson junction that can comprise a first superconductor contact 1232, a tunnel barrier layer 1234, and a second superconductor contact 1236. Also provided in Level 3 can be a CPW.

It is noted that although particular qubits and/or microwave circuits are illustrated and described with respect to particular locations in the quantum information device 1200, the disclosed aspects are not limited to this example. Instead, other locations can be selected for the one or more microwave circuits and/or qubits. In some implementations, the qubits can comprise a planar qubit, a vertical Josephson junction, or combinations thereof. In addition, one or more microwave circuits can be selected from a group comprising a buried coplanar waveguide, a buried microstrip, a microstrip, and a slot line.

According to some implementations, crystalline silicon can surround the one or more circuits as a dielectric with low loss tangent. The process of manufacturing the quantum information device 1200 (as well as other quantum information devices discussed herein) can be similar to the process discussed with respect to FIGS. 1-11 discussed above.

Figure 13:
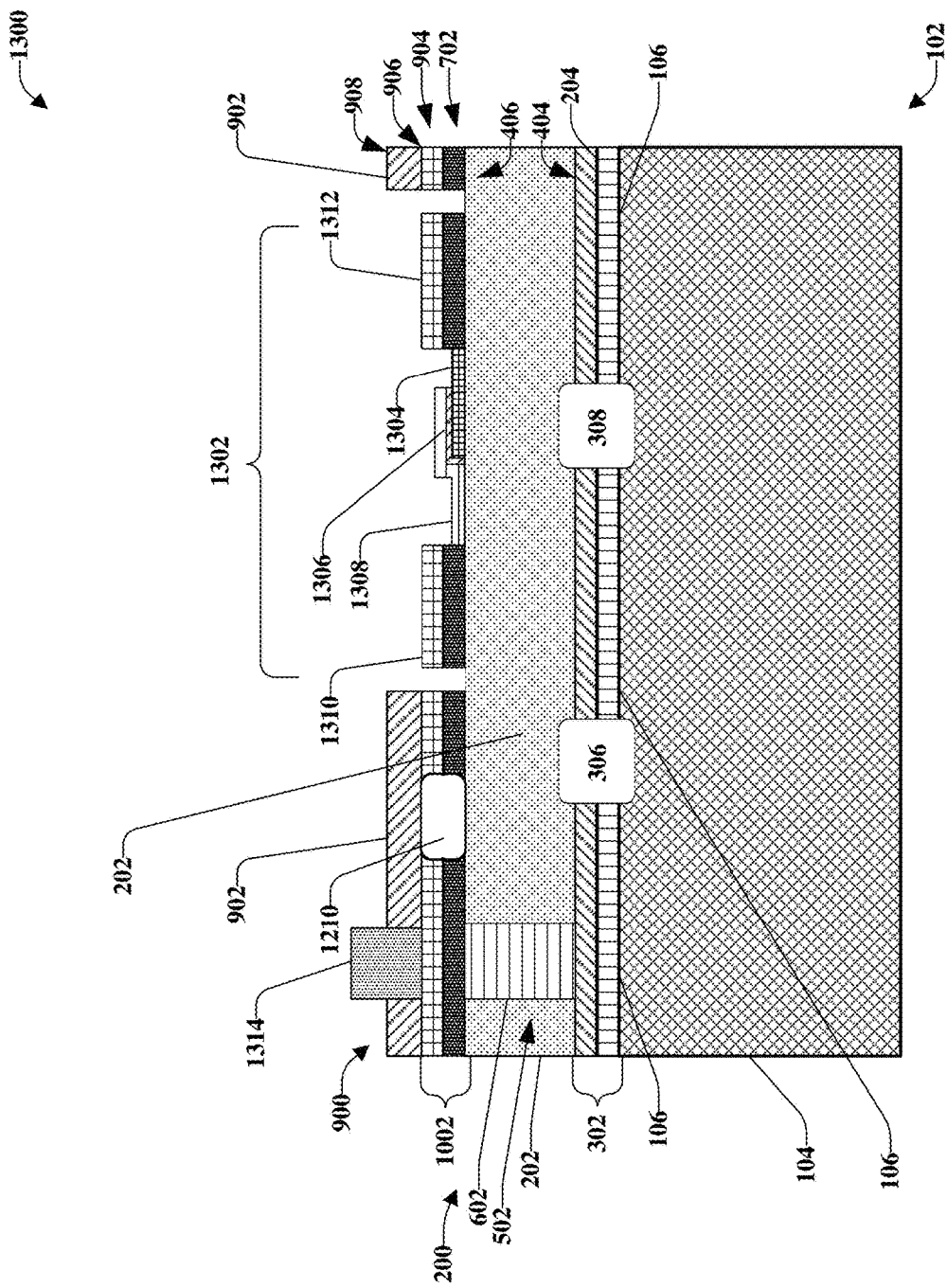
FIG. 13 illustrates an example, non-limiting, side cross-sectional view of a structure for an embodiment of another quantum information device that comprises a planar Josephson junction transmon in a second level in accordance with one or more embodiments described herein.

FIG. 13 illustrates an example, non-limiting, side cross-sectional view of a structure for an embodiment of another quantum information device 1300 that comprises a planar Josephson junction transmon in a second level in accordance with one or more embodiments described herein. Repetitive description of like elements employed in other embodiments described herein is omitted for sake of brevity.

A qubit 1302 can be formed in the second buried layer 1002. The qubit can comprise a Josephson junction, which can comprise a first superconductor contact 1304, a tunnel barrier layer 1306, and a second superconductor contact 1308. As illustrated, the Josephson junction can be a planar Josephson junction.

The qubit 1302 can also comprise one or more capacitor pads, such as a first capacitor pad 1310 and a second capacitor pad 1312. The first capacitor pad 1310 and the second capacitor pad 1312 can comprise respective portions of the superconducting film 702 and respective portions of the third patterned superconducting layer 904.

Although portions of the third crystalline silicon layer 902 are illustrated as removed over the first capacitor pad 1310 and the second capacitor pad 1312, the disclosed aspects are not limited to this implementation. According to some implementations, silicon can remain over the first capacitor pad 1310 and/or the second capacitor pad 1312.

According to an implementation, other elements or circuits (e.g., element 1314) can be created (e.g., similar to the elements illustrated in FIG. 12). For example, resonators, ground isolation moats, and/or other structures can be etched on the top silicon wafer (e.g., the third crystalline silicon layer 902) and buried metal (e.g., the second buried layer 1002). There can be different structures located within the top and bottom metals (e.g., in the first buried layer 302, in the second buried layer 1002), over the top silicon wafer (e.g., the third crystalline silicon layer 902, and/or the second surface 908), and/or over the buried metal (e.g., the second buried layer 1002).

In the example illustrated in FIG. 13, the transmon and shadow-evaporated Josephson junctions can be etched to create a mechanically floating qubit in Level 2. The silicon (e.g., the third crystalline silicon layer 902) can comprise a thickness that is defined based on the configuration of the top circuit, for example, the circuit on the top silicon wafer (e.g., the third crystalline silicon layer 902) and buried metal (e.g., the second buried layer 1002).

Figure 14:
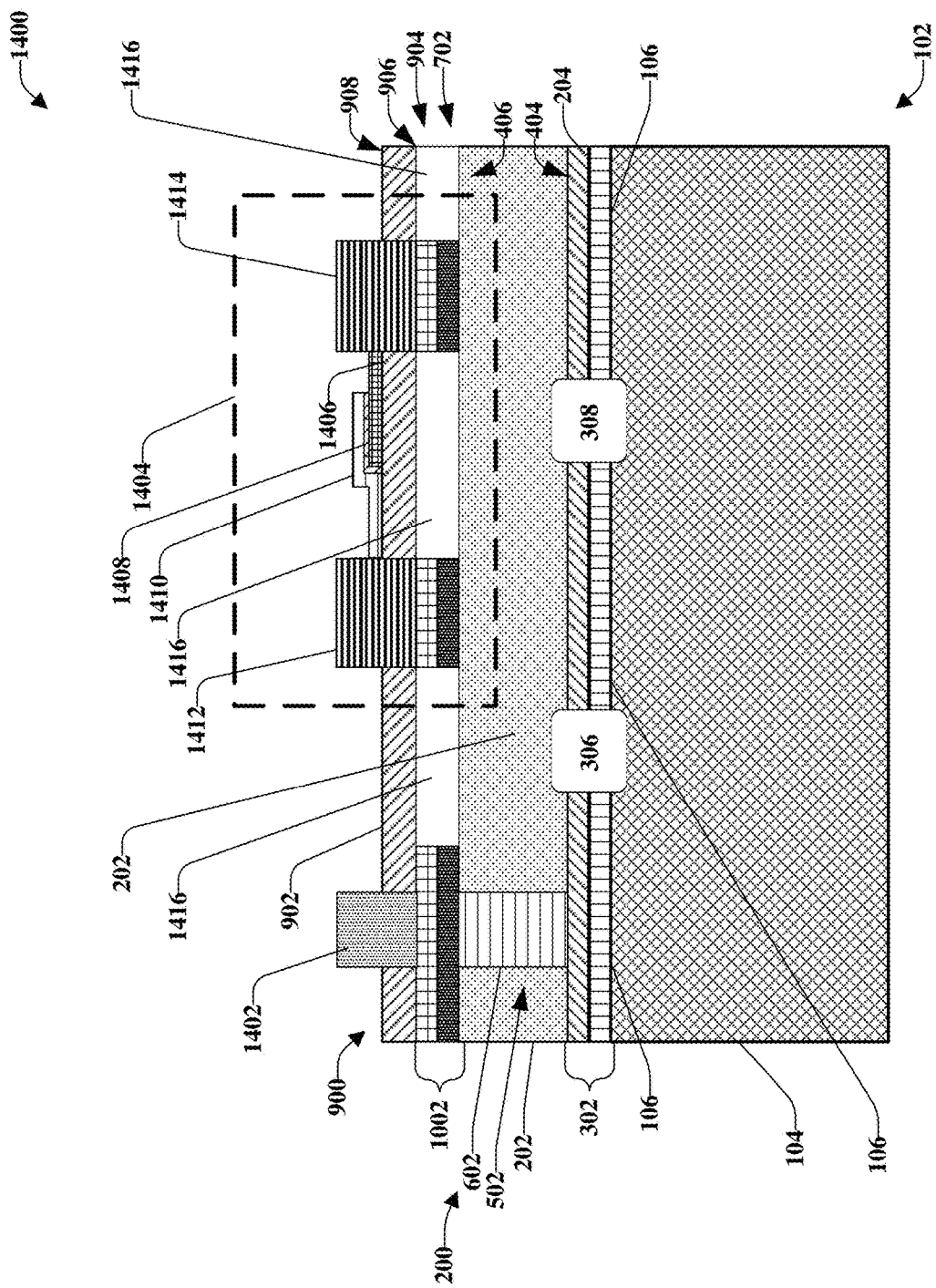
FIG. 14 illustrates an example, non-limiting, side cross-sectional view of a structure for an embodiment of another quantum information device that comprises a planar Josephson junction transmon on a top surface in accordance with one or more embodiments described herein.
Figure 15:
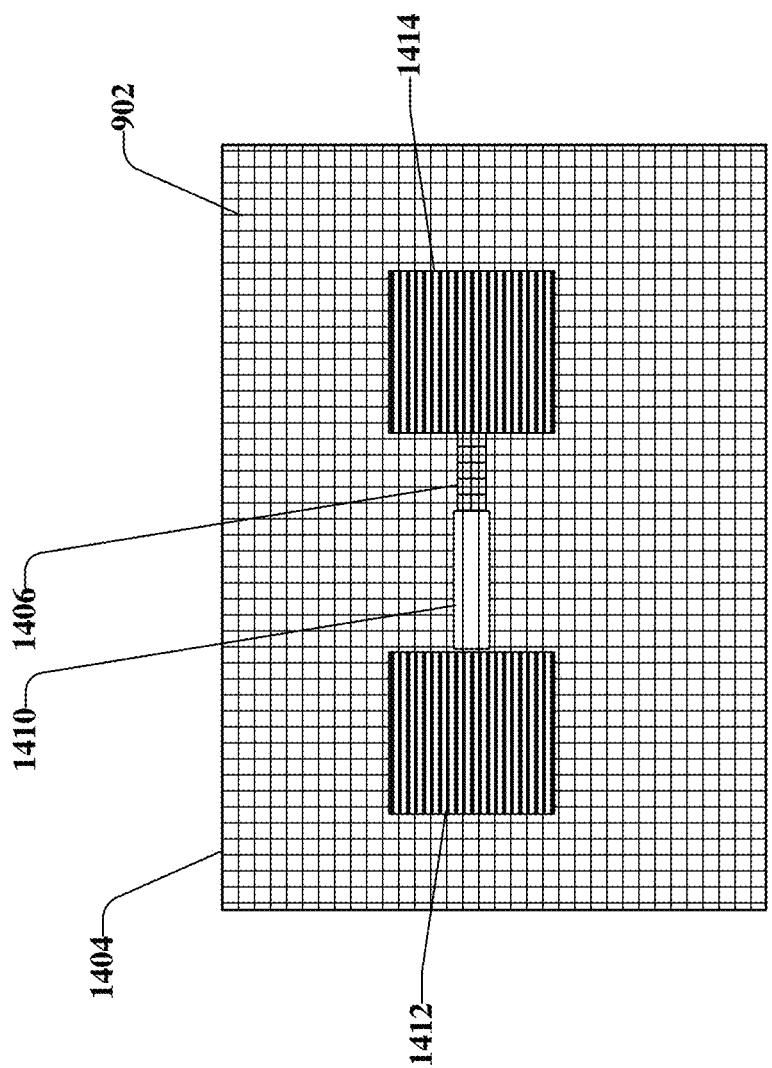
FIG. 15 illustrates an example, non-limiting, top view of a portion of the quantum information device of FIG. 14 in accordance with one or more embodiments described herein.

FIG. 14 illustrates an example, non-limiting, side cross-sectional view of a structure for an embodiment of another quantum information device 1400 that comprises a planar Josephson junction transmon on a top surface in accordance with one or more embodiments described herein. FIG. 15 illustrates an example, non-limiting, top view of a portion of the quantum information device 1400 of FIG. 14 in accordance with one or more embodiments described herein. Repetitive description of like elements employed in other embodiments described herein is omitted for sake of brevity.

According to an implementation, other elements or circuits (e.g., element 1402) can be created. For example, resonators, ground isolation moats, and/or other structures can be etched on the top silicon wafer (e.g., the third crystalline silicon layer 902) and buried metal (e.g., the second buried layer 1002). There can be different structures located on the top and bottom metals (e.g., in the first buried layer 302, in the second buried layer 1002) over the top silicon wafer (e.g., the third crystalline silicon layer 902) and buried metal (e.g., the second buried layer 1002).

As illustrated, a qubit 1404 (represented within the dotted square area) can be formed over the third wafer 900. The qubit 1404 can comprise a planar Josephson junction that can comprise a first superconductor contact 1406, a tunnel barrier layer 1408, and a second superconductor contact 1410. The qubit 1404 can also comprise one or more capacitor pads, illustrated as a first capacitor pad 1412 and a second capacitor pad 1414. The first capacitor pad 1412 and the second capacitor pad 1414 can comprise respective portions of the superconducting film 702, respective portions of the third patterned superconducting layer 904, and a layer of superconducting metal deposited over the second buried layer 1002.

In the example illustrated in FIG. 14, the transmon and shadow-evaporated Josephson junctions can be etched to create a mechanically floating qubit. To create the mechanically floating qubit (e.g., the qubit 1404) voiding can be performed under the third crystalline silicon layer 902 (e.g., within the second buried layer 1002), illustrated by voided areas 1416. The voiding can prevent the transmon from being overcoupled to ground. The qubit 1404 can be on a membrane. According to some implementations, the silicon (e.g., the third crystalline silicon layer 902) can comprise a thickness that can be thick in order to provide rigidity.

There are no holes through the top dielectric (third silicon layer of third wafer 900), other than for vias. Further, the capacitor pads of the transmon (e.g., the first capacitor pad 1412 and the second capacitor pad 1414) can be etched into silicon to make a tall capacitor pad. Thus, the capacitor pads can be vertical capacitor pads that extend into the quantum information device 1400. Thicker silicon can increase a total height of capacitor and reduce the footprint of the transmon.

Figure 16:
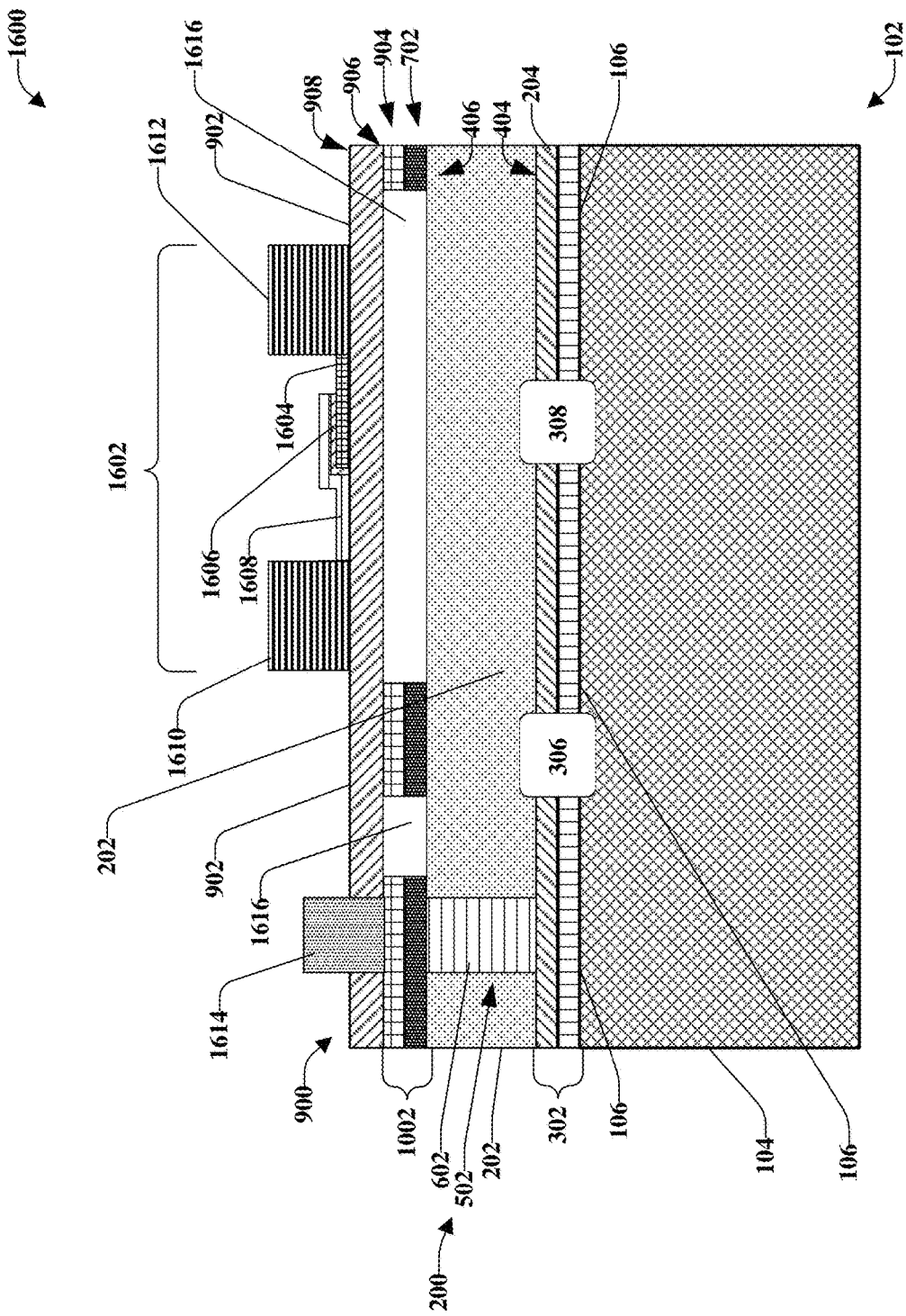
FIG. 16 illustrates an example, non-limiting, side cross-sectional view of a structure for an embodiment of a quantum information device that comprises a planar Josephson junction transmon on a top surface in accordance with one or more embodiments described herein.

FIG. 16 illustrates an example, non-limiting, side cross-sectional view of a structure for an embodiment of a quantum information device 1600 that comprises a planar Josephson junction transmon on a top surface in accordance with one or more embodiments described herein. Repetitive description of like elements employed in other embodiments described herein is omitted for sake of brevity.

A qubit 1602 can be formed over the third wafer 900 (e.g., over the third crystalline silicon layer 902). The qubit 1602 can comprise a Josephson junction, which can comprise a first superconductor contact 1604, a tunnel barrier layer 1606, and a second superconductor contact 1608. As illustrated, the Josephson junction can be a planar Josephson junction. The qubit 1602 can also comprise a first capacitor pad 1610 and a second capacitor pad 1612.

According to an implementation, other elements or circuits (e.g., element 1614) can be created. For example, resonators, ground isolation moats, and/or other structures can be etched on the top silicon wafer (e.g., the third crystalline silicon layer 902) and buried metal (e.g., the second buried layer 1002). There can be different structures located on the top and bottom metals (e.g., in the first buried layer 302, in the second buried layer 1002) over the top silicon wafer (e.g., the third crystalline silicon layer 902) and buried metal (e.g., the second buried layer 1002). For example, microwave circuits similar to those described with respect to FIG. 12 and other figures can be utilized for the quantum information device 1600.

In the example illustrated in FIG. 16, the transmon and shadow-evaporated Josephson junctions can be etched to create a mechanically floating qubit. To create the mechanically floating qubit (e.g., the qubit 1602) voiding can be performed under the third crystalline silicon layer 902 (e.g., within the second buried layer 1002), illustrated by voided areas 1616. The voiding can prevent the transmon from being overcoupled to ground. The qubit 1602 can be on a membrane. According to some implementations, the silicon (e.g., the third crystalline silicon layer 902) can comprise a thickness that can be thick in order to provide rigidity.

There are no holes through the top dielectric (third silicon layer of third wafer 900), other than for vias. Further, the capacitor pads of the transmon (e.g., the first capacitor pad 1610 and the second capacitor pad 1612) can be etched into silicon to make a tall capacitor pad. Thicker silicon can increase a total height of capacitor and reduce the footprint of the transmon.

Figure 17:
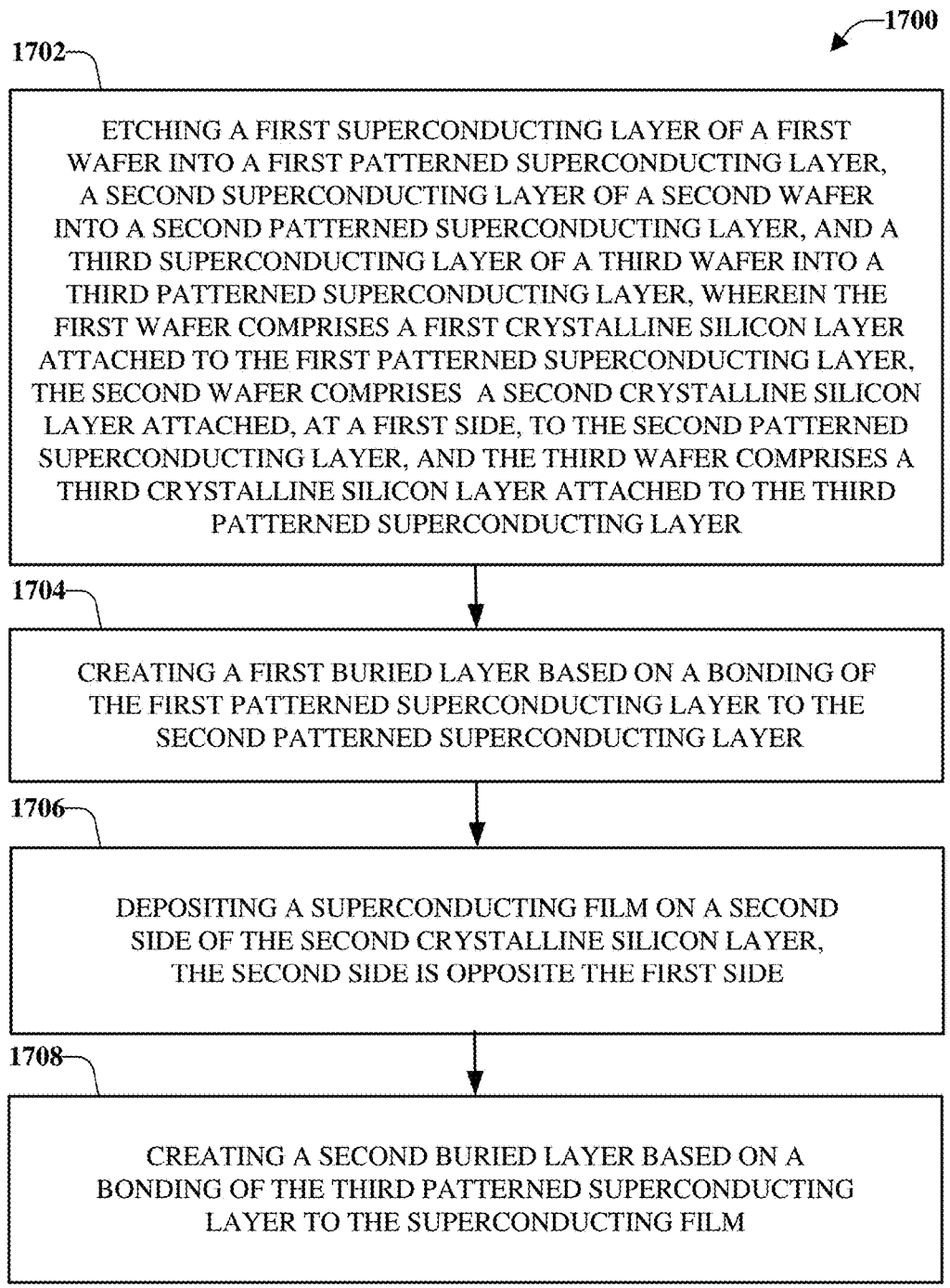
FIG. 17 illustrates a flow diagram of an example, non-limiting, method for fabricating a quantum information device in accordance with one or more embodiments described herein.

FIG. 17 illustrates a flow diagram of an example, non-limiting, method 1700 for fabricating a quantum information device in accordance with one or more embodiments described herein. Repetitive description of like elements employed in other embodiments described herein is omitted for sake of brevity.

The method 1700 can include, at 1702, etching a first superconducting layer of a first wafer (e.g., the first wafer 102) into a first patterned superconducting layer (e.g., the first patterned superconducting layer 106), a second superconducting layer of a second wafer (e.g., the second wafer 200) into a second patterned superconducting layer (e.g., the second patterned superconducting layer 204), and a third superconducting layer of a third wafer (e.g., the third wafer 900) into a third patterned superconducting layer (e.g., the third patterned superconducting layer 904). The first wafer can comprise a first crystalline silicon layer (e.g., the first crystalline silicon layer 104) attached to the first patterned superconducting layer. The second wafer can comprise a second crystalline silicon layer (e.g., the second crystalline silicon layer 202) attached, at a first side (e.g., the first side 404), to the second patterned superconducting layer. Further, the third wafer can comprise a third crystalline silicon layer (e.g., the third crystalline silicon layer 902) attached to the third patterned superconducting layer.

Creating a first buried layer (e.g., the first buried layer 302), at 1704 of the method 1700, can be based on a bonding of the first patterned superconducting layer to the second patterned superconducting layer. A superconducting film (e.g., the superconducting film 702) can be deposited, at 1706 of the method 1700, on a second side (e.g., the second side 406) of the second crystalline silicon layer. The second side can be opposite the first side.

Further, the method 1700 can include, at 1708, creating a second buried layer (e.g., the second buried layer 1002) based on a bonding of the third patterned superconducting layer to the superconducting film. According to some implementations, a through-silicon via (e.g., the via 502) can be etched between the first buried layer and the superconducting film. The through-silicon via can be filled with a superconducting metal (e.g., the superconducting metal 602). Additionally, one or more microwave circuits can be formed. The one or more microwave circuits formed can be selected from a group comprising a buried coplanar waveguide, a buried microstrip, a microstrip, and a slot line, or combinations thereof.

Figure 18:
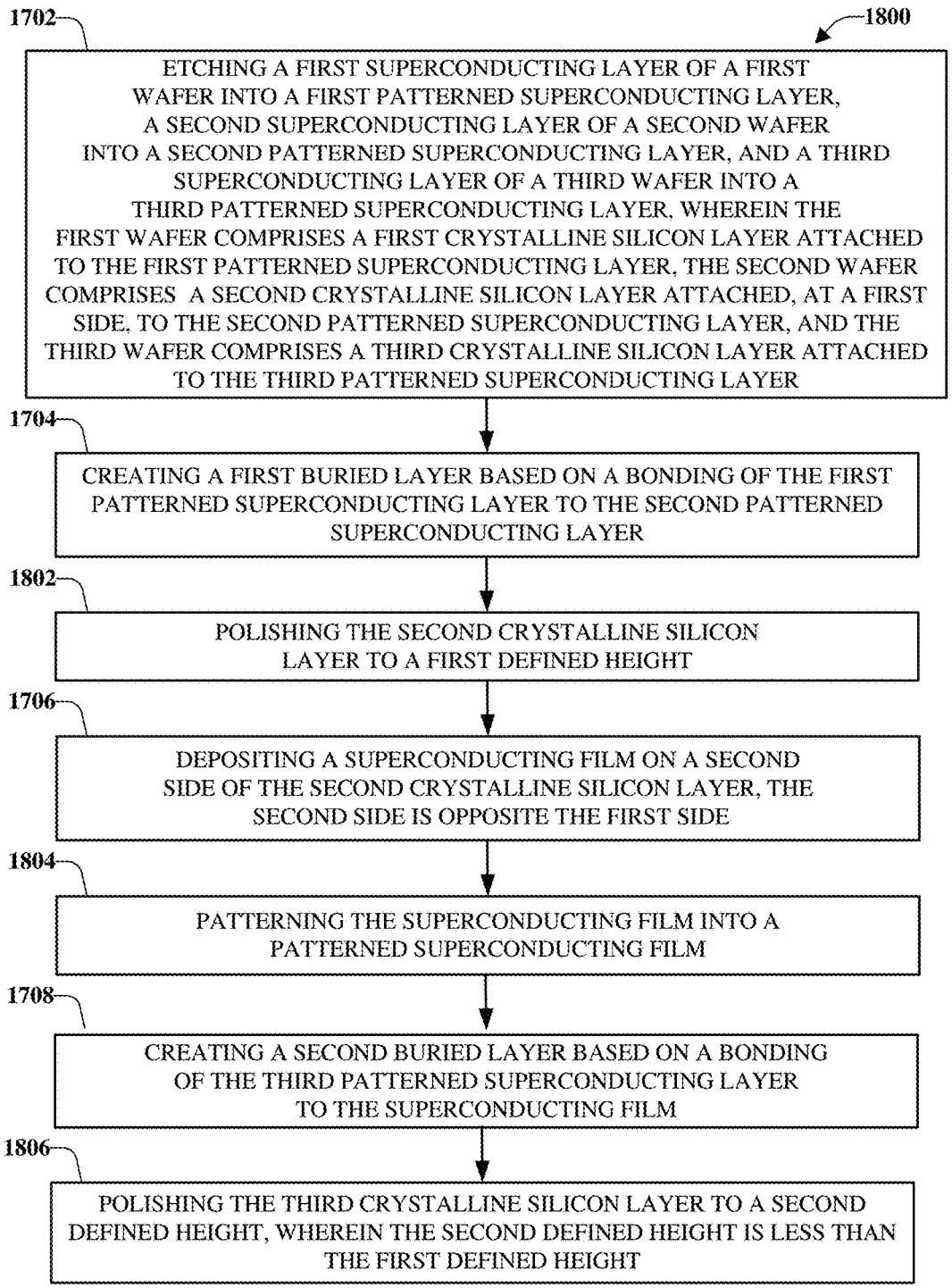
FIG. 18 illustrates a flow diagram of another example, non-limiting, method for fabricating a quantum information device in accordance with one or more embodiments described herein.

FIG. 18 illustrates a flow diagram of another example, non-limiting, method 1800 for fabricating a quantum information device in accordance with one or more embodiments described herein. Repetitive description of like elements employed in other embodiments described herein is omitted for sake of brevity.

Prior to depositing the superconducting film on the second side of the second crystalline silicon layer, at 1706, the method 1800 can comprise polishing the second crystalline silicon layer to a first defined height (e.g., the second height 402), at 1802. Upon or after depositing the superconducting film on the second crystalline silicon layer, at 1706, the method 1800 can comprise patterning the superconducting film into a patterned superconducting film, at 1804.

In addition, upon or after bonding the third patterned superconducting layer and the patterned superconducting film at 1708, the method 1800 can comprise polishing the third crystalline silicon layer to a second defined height, at 1806. The second defined height can be less than the first defined height according to some implementations. However, according to some implementations, the second defined height can be the same height, a similar height, or a different height than the first defined height.

Figure 19:
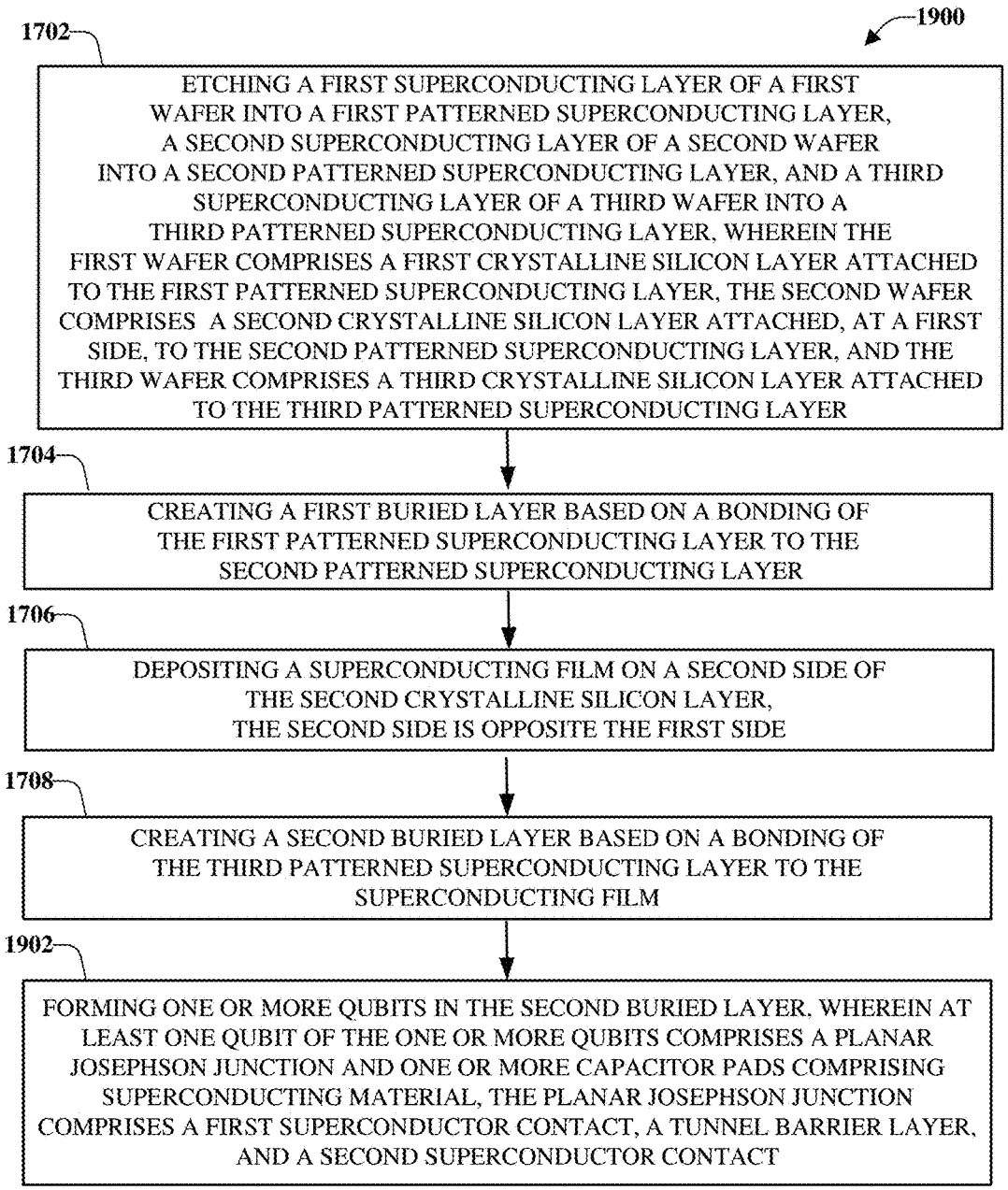
FIG. 19 illustrates a flow diagram of another example, non-limiting, method for fabricating a quantum information device that comprises a planar Josephson junction in a second level in accordance with one or more embodiments described herein.

FIG. 19 illustrates a flow diagram of another example, non-limiting, method 1900 for fabricating a quantum information device that comprises a planar Josephson junction in a second level in accordance with one or more embodiments described herein. Repetitive description of like elements employed in other embodiments described herein is omitted for sake of brevity.

At 1902 of the method 1900, one or more qubits (e.g., the qubit 1302) can be formed in the second buried layer. At least one qubit of the one or more qubits can comprise a planar Josephson junction and one or more capacitor pads (e.g., the first capacitor pad 1310, the second capacitor pad 1312) comprising superconducting material. The planar Josephson junction can comprise a first superconductor contact (e.g., the first superconductor contact 1304), a tunnel barrier layer (e.g., the tunnel barrier layer 1306), and a second superconductor contact (e.g., the second superconductor contact 1308).

Figure 20:
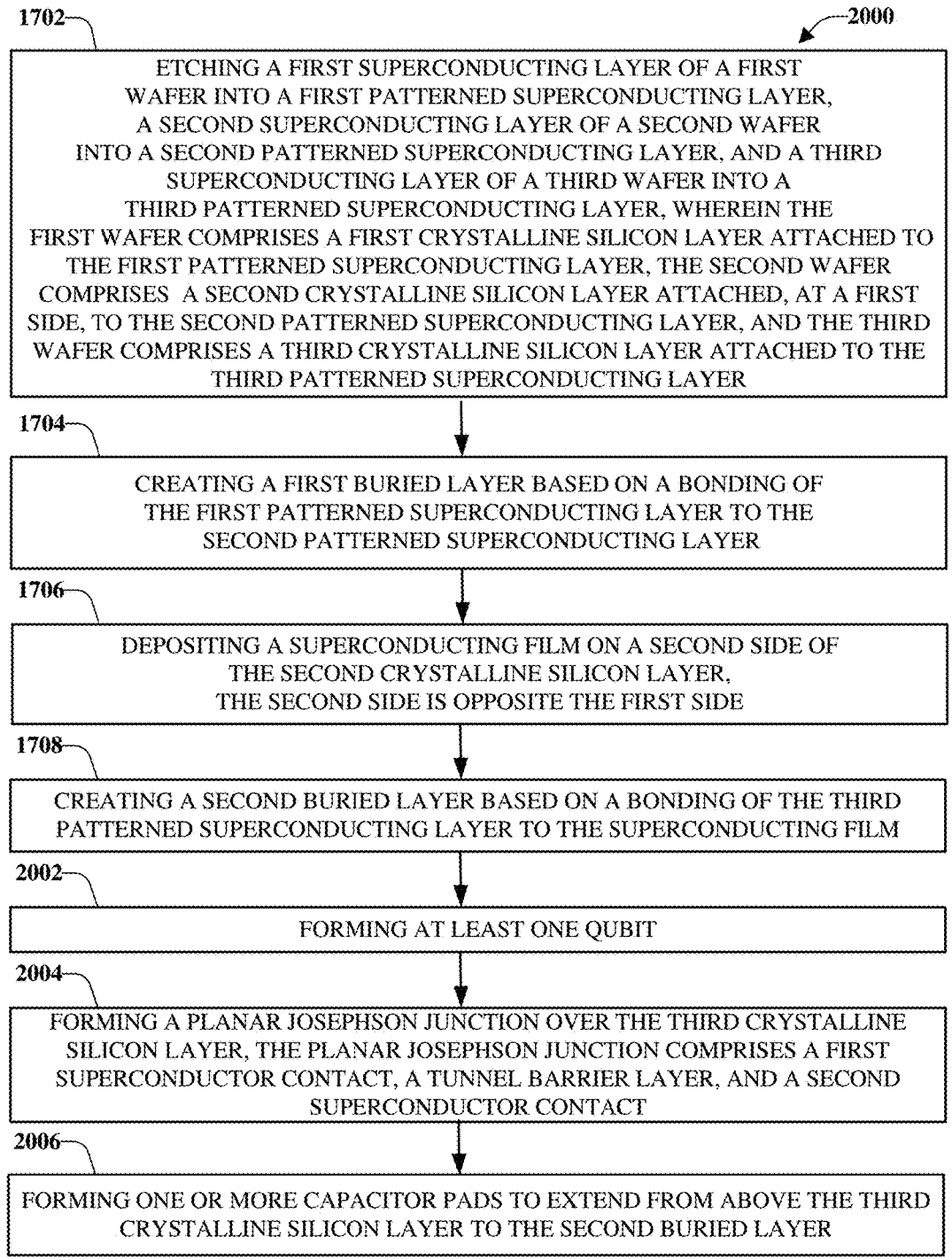
FIG. 20 illustrates a flow diagram of another example, non-limiting, method for fabricating a quantum information device that comprises a planar Josephson junction on a top surface with deep capacitor pads in accordance with one or more embodiments described herein.

FIG. 20 illustrates a flow diagram of another example, non-limiting, method 2000 for fabricating a quantum information device that comprises a planar Josephson junction on a top surface with deep capacitor pads in accordance with one or more embodiments described herein. Repetitive description of like elements employed in other embodiments described herein is omitted for sake of brevity.

At 2002 of the method 2000 at least one qubit (e.g., the qubit 1404) can be formed. To form the at least one qubit, at 2004 of the method, 2000, a planar Josephson junction can be formed over the third crystalline silicon layer. The planar Josephson junction can comprise a first superconductor contact (e.g., the first superconductor contact 1406), a tunnel barrier layer (e.g., the tunnel barrier layer 1408), and a second superconductor contact (e.g., the second superconductor contact 1410). Further, at 2006 of the method 2000, one or more capacitor pads (e.g., the first capacitor pad 1412, the second capacitor pad 1414) can be formed to extend from above the third crystalline silicon layer to the second buried layer. The one or more capacitor pads can comprise superconducting material.

Figure 21:
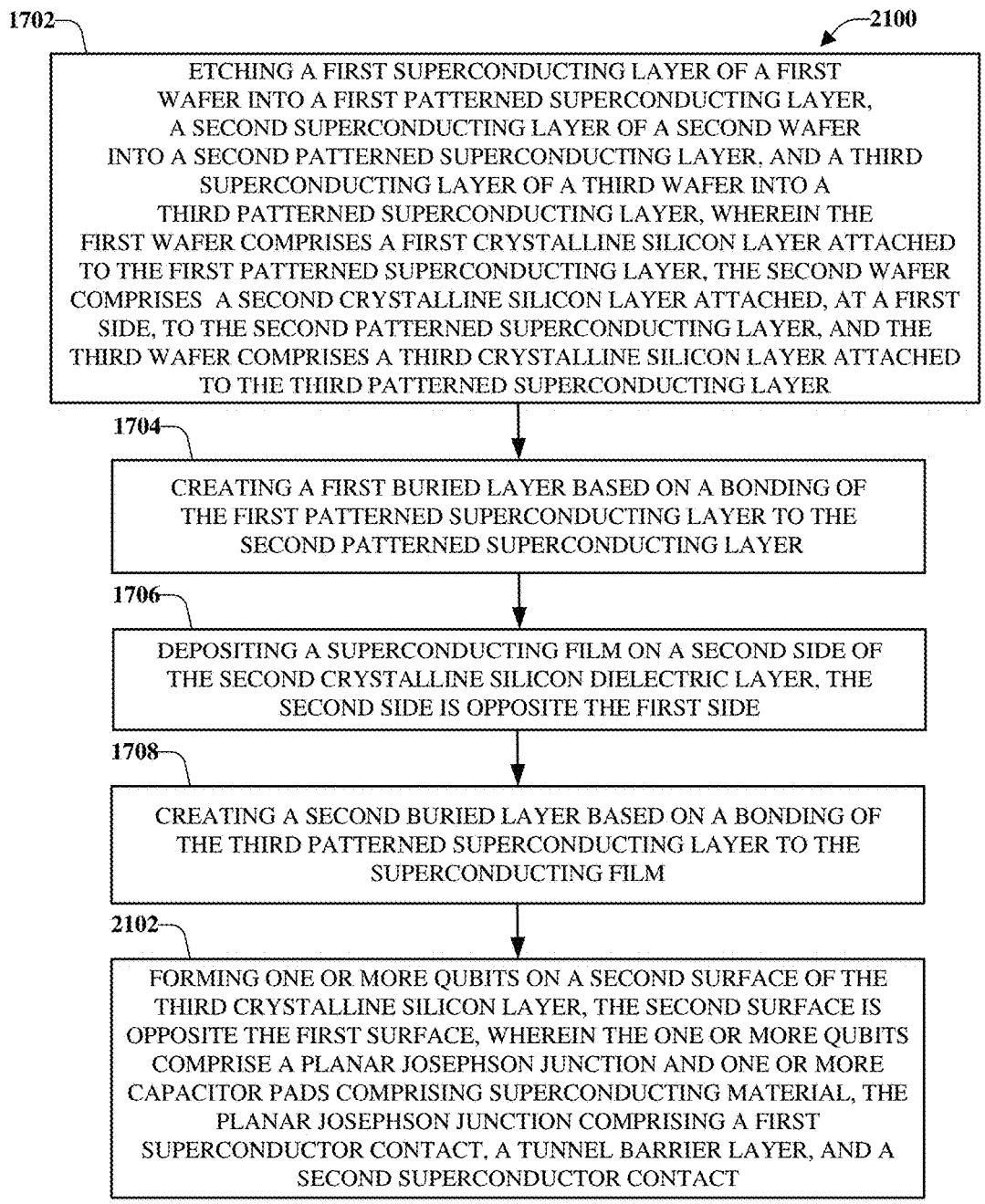
FIG. 21 illustrates a flow diagram of another example, non-limiting, method for fabricating a quantum information device that comprises a planar Josephson junction on a top surface in accordance with one or more embodiments described herein.

FIG. 21 illustrates a flow diagram of another example, non-limiting, method 2100 for fabricating a quantum information device that comprises a planar Josephson junction on a top surface in accordance with one or more embodiments described herein. Repetitive description of like elements employed in other embodiments described herein is omitted for sake of brevity.

The third patterned superconducting layer can be located on a first surface (e.g., the first surface 906) of the third crystalline silicon layer. At 2102 of the method 2100, one or more qubits (e.g., the qubit 1602) can be formed on a second surface (e.g., the second surface 908) of the third crystalline silicon layer. The second surface can be opposite the first surface. The one or more qubits can comprise a planar Josephson junction and one or more capacitor pads (e.g., the first capacitor pad 1610, the second capacitor pad 1612) comprising superconducting material. The planar Josephson junction can comprise a first superconductor contact (e.g., the first superconductor contact 1604), a tunnel barrier layer (e.g., the tunnel barrier layer 1606), and a second superconductor contact (e.g., the second superconductor contact 1608).

Disclosed embodiments and/or aspects should neither be presumed to be exclusive of other disclosed embodiments and/or aspects, nor should a device and/or structure be presumed to be exclusive to its depicted elements in an example embodiment or embodiments of this disclosure, unless where clear from context to the contrary. The scope of the disclosure is generally intended to encompass modifications of depicted embodiments with additions from other depicted embodiments, where suitable, interoperability among or between depicted embodiments, where suitable, as well as addition of a component(s) from one embodiment(s) within another or subtraction of a component(s) from any depicted embodiment, where suitable, aggregation of elements (or embodiments) into a single devices achieving aggregate functionality, where suitable, or distribution of functionality of a single device into multiple device, where suitable. In addition, incorporation, combination or modification of devices or elements depicted herein or modified as stated above with devices, structures, or subsets thereof not explicitly depicted herein but known in the art or made evident to one with ordinary skill in the art through the context disclosed herein are also considered within the scope of the present disclosure.

For simplicity of explanation, the computer-implemented methodologies are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts can be required to implement the computer-implemented methodologies in accordance with the disclosed subject matter. In addition, those skilled in the art will understand and appreciate that the computer-implemented methodologies could alternatively be represented as a series of interrelated states via a state diagram or events. Additionally, it should be further appreciated that the computer-implemented methodologies disclosed hereinafter and throughout this specification are capable of being stored on an article of manufacture to facilitate transporting and transferring such computer-implemented methodologies to computers. The term article of manufacture, as used herein, is intended to encompass a computer program accessible from any computer-readable device or storage media.

Figure 22:
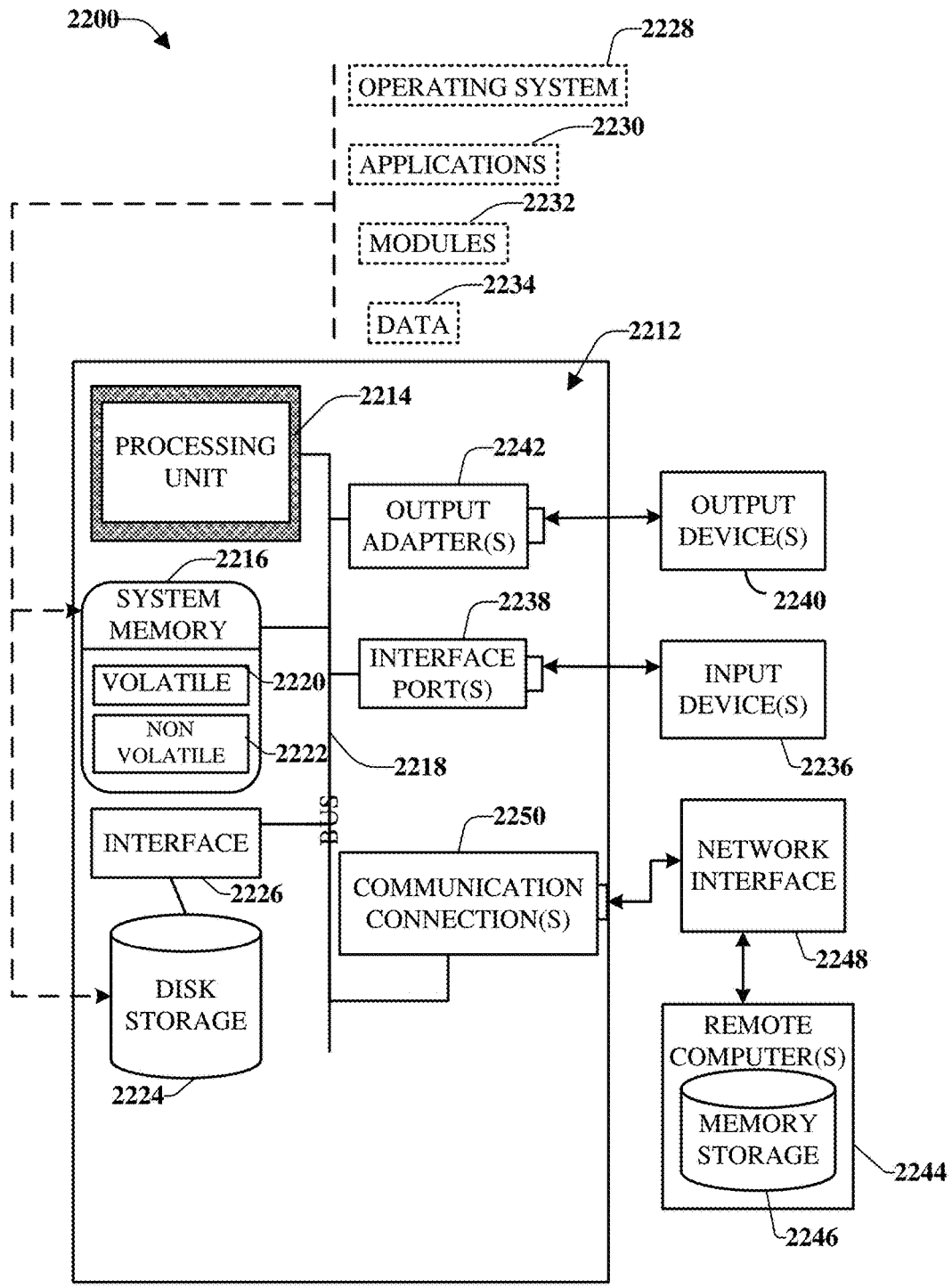
FIG. 22 illustrates a block diagram of an example, non-limiting, operating environment in which one or more embodiments described herein can be facilitated.

In order to provide a context for the various aspects of the disclosed subject matter, FIG. 22 as well as the following discussion are intended to provide a general description of a suitable environment in which the various aspects of the disclosed subject matter can be implemented. FIG. 22 illustrates a block diagram of an example, non-limiting operating environment in which one or more embodiments described herein can be facilitated. Repetitive description of like elements employed in other embodiments described herein is omitted for sake of brevity. With reference to FIG. 22, a suitable operating environment 2200 for implementing various aspects of this invention can also include a computer 2212. The computer 2212 can also include a processing unit 2214, a system memory 2216, and a system bus 2218. The system bus 2218 couples system components including, but not limited to, the system memory 2216 to the processing unit 2214. The processing unit 2214 can be any of various available processors. Dual microprocessors and other multiprocessor architectures also can be employed as the processing unit 2214. The system bus 2218 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1394), and Small Computer Systems Interface (SCSI). The system memory 2216 can also include volatile memory 2220 and nonvolatile memory 2222. The basic input/output system (BIOS), containing the basic routines to transfer information between elements within the computer 2212, such as during start-up, is stored in nonvolatile memory 2222. By way of illustration, and not limitation, nonvolatile memory 2222 can include read only memory (ROM), programmable ROM (PROM), electrically programmable ROM (EPROM), electrically erasable programmable ROM (EEPROM), flash memory, or nonvolatile random access memory (RAM) (e.g., ferroelectric RAM (FeRAM)). Volatile memory 2220 can also include random access memory (RAM), which acts as external cache memory. By way of illustration and not limitation, RAM is available in many forms such as static RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM.

Computer 2212 can also include removable/non-removable, volatile/non-volatile computer storage media. FIG. 22 illustrates, for example, a disk storage 2224. Disk storage 2224 can also include, but is not limited to, devices like a magnetic disk drive, floppy disk drive, tape drive, Jaz drive, Zip drive, LS-100 drive, flash memory card, or memory stick. The disk storage 2224 also can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage 2224 to the system bus 2218, a removable or non-removable interface is typically used, such as interface 2226. FIG. 22 also depicts software that acts as an intermediary between users and the basic computer resources described in the suitable operating environment 2200. Such software can also include, for example, an operating system 2228. Operating system 2228, which can be stored on disk storage 2224, acts to control and allocate resources of the computer 2212. System applications 2230 take advantage of the management of resources by operating system 2228 through program modules 2232 and program data 2234, e.g., stored either in system memory 2216 or on disk storage 2224. It is to be appreciated that this invention can be implemented with various operating systems or combinations of operating systems. A user enters commands or information into the computer 2212 through input device(s) 2236. Input devices 2236 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 2214 through the system bus 2218 via interface port(s) 2238. Interface port(s) 2238 include, for example, a serial port, a parallel port, a game port, and a universal serial bus (USB). Output device(s) 2240 use some of the same type of ports as input device(s) 2236. Thus, for example, a USB port can be used to provide input to computer 2212, and to output information from computer 2212 to an output device 2240. Output adapter 2242 is provided to illustrate that there are some output devices 2240 like monitors, speakers, and printers, among other output devices 2240, which require special adapters. The output adapters 2242 include, by way of illustration and not limitation, video and sound cards that provide a method of connection between the output device 2240 and the system bus 2218. It should be noted that other devices and/or systems of devices provide both input and output capabilities such as remote computer(s) 2244.

Computer 2212 can operate in a networked environment using logical connections to one or more remote computers, such as remote computer(s) 2244. The remote computer(s) 2244 can be a computer, a server, a router, a network PC, a workstation, a microprocessor based appliance, a peer device or other common network node and the like, and typically can also include many or all of the elements described relative to computer 2212. For purposes of brevity, only a memory storage device 2246 is illustrated with remote computer(s) 2244. Remote computer(s) 2244 is logically connected to computer 2212 through a network interface 2248 and then physically connected via communication connection 2250. Network interface 2248 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 2250 refers to the hardware/software employed to connect the network interface 2248 to the system bus 2218. While communication connection 2250 is shown for illustrative clarity inside computer 2212, it can also be external to computer 2212. The hardware/software for connection to the network interface 2248 can also include, for exemplary purposes only, internal and external technologies such as, modems including regular telephone grade modems, cable modems and DSL modems, ISDN adapters, and Ethernet cards.

The present invention may be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create method for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this invention also can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments where tasks are performed by remote processing devices that are linked through a communications network. However, some, if not all aspects of this invention can be practiced on stand-alone computers. In a distributed computing environment, program modules can be located in both local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other method to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this specification, terms such as "store," "storage," "data store," "data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or non-volatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this invention, but one of ordinary skill in the art can recognize that many further combinations and permutations of this invention are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim. The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A superconducting structure, comprising:
   a first buried layer that comprises a first patterned superconducting layer of a first wafer bonded to a second patterned superconducting layer of a second wafer, wherein a first pattern of the first patterned superconducting layer mirrors a second pattern of the second patterned superconducting layer, and the first pattern having a matching mirrored alignment with the second pattern;
   a patterned superconducting film attached to the second wafer; and
   a second buried layer that comprises a third patterned superconducting layer of a third wafer bonded to the patterned superconducting film that is attached to the second wafer.

2. The superconducting structure of claim 1, wherein the first wafer comprises a first crystalline silicon layer that is attached to the first patterned superconducting layer, wherein the second wafer comprises a second crystalline silicon layer that is attached, at a first side, to the second patterned superconducting layer, wherein the patterned superconducting film is attached to a second side of the second crystalline silicon layer, the second side is opposite the first side, and wherein the third wafer comprises a third crystalline silicon layer that is attached to the third patterned superconducting layer.

3. The superconducting structure of claim 1, wherein the third patterned superconducting layer comprises a third pattern, and the patterned superconducting film comprises a fourth pattern.

4. The superconducting structure of claim 3, wherein the third pattern mirrors the fourth pattern.

5. The superconducting structure of claim 1, further comprising a through-silicon via located between the first buried layer and the second buried layer, the through-silicon via is filled with a superconducting metal.

6. The superconducting structure of claim 1, further comprising one or more microwave circuits in at least one of the first buried layer or the second buried layer, wherein the one or more microwave circuits are selected from a group consisting of a buried coplanar waveguide, a buried microstrip, a microstrip, and a slot line.

7. The superconducting structure of claim 1, further comprising:
   one or more qubits in the second buried layer, wherein at least one qubit of the one or more qubits comprises a planar Josephson junction and one or more capacitor pads comprising superconducting material, wherein the planar Josephson junction comprises a first superconductor contact, a tunnel barrier layer, and a second superconductor contact.

8. The superconducting structure of claim 1, further comprising:
   one or more qubits, wherein at least one qubit of the one or more qubits comprises a planar Josephson junction and one or more capacitor pads comprising superconducting material, wherein the planar Josephson junction comprises a first superconductor contact, a tunnel barrier layer, and a second superconductor contact,
   wherein the planar Josephson junction is located over a third crystalline silicon layer of the third wafer, and
   wherein the one or more capacitor pads extend from above the third crystalline silicon layer to the second buried layer.

9. The superconducting structure of claim 1, wherein the third patterned superconducting layer is attached to a first surface of a third crystalline silicon layer of the third wafer, the superconducting structure further comprising:
   one or more qubits on a second surface of the third crystalline silicon layer, the second surface is opposite the first surface, wherein the one or more qubits comprise a planar Josephson junction and one or more capacitor pads comprising superconducting material, wherein the planar Josephson junction comprises a first superconductor contact, a tunnel barrier layer, and a second superconductor contact.

10. The superconducting structure of claim 1, wherein the patterned superconducting film is a first patterned superconducting film, and wherein the third patterned superconducting layer is attached to a first surface of a third crystalline silicon layer of the third wafer, the superconducting structure further comprising:
    a second patterned superconducting film attached to a second surface of the third crystalline silicon layer, the second surface is opposite the first surface.

11. A method, comprising:
    etching a first superconducting layer of a first wafer into a first patterned superconducting layer, a second superconducting layer of a second wafer into a second patterned superconducting layer, and a third superconducting layer of a third wafer into a third patterned superconducting layer, wherein a first pattern of the first patterned superconducting layer mirrors a second pattern of the second patterned superconducting layer;
    creating a first buried layer based on a first bonding of the first patterned superconducting layer of the first wafer to the second patterned superconducting layer of the second wafer with the first pattern having a matching mirrored alignment with the second pattern; and
    creating a second buried layer based on a second bonding of the third patterned superconducting layer of the third wafer to a superconducting film deposited on the second wafer.

12. The method of claim 11, wherein the first wafer comprises a first crystalline silicon layer attached to the first patterned superconducting layer, the second wafer comprises a second crystalline silicon layer attached, at a first side, to the second patterned superconducting layer, the third wafer comprises a third crystalline silicon layer attached to the third patterned superconducting layer, and the superconducting film is attached to a second side of the second crystalline silicon layer, the second side is opposite the first side.

13. The method of claim 11, further comprising:
etching a through-silicon via between the first buried layer and the superconducting film; and
filling the through-silicon via with a superconducting metal.

14. The method of claim 11, further comprising:
forming one or more microwave circuits in at least one of the first buried layer or the second buried layer, wherein the one or more microwave circuits are selected from a group consisting of a buried coplanar waveguide, a buried microstrip, a microstrip, and a slot line.

15. The method of claim 11, further comprising:
forming one or more qubits in the second buried layer, wherein at least one qubit of the one or more qubits comprises a planar Josephson junction and one or more capacitor pads comprising superconducting material, the planar Josephson junction comprises a first superconductor contact, a tunnel barrier layer, and a second superconductor contact.

16. The method of claim 11, further comprising:
forming at least one qubit that comprises a planar Josephson junction and one or more capacitor pads comprising superconducting material, wherein the planar Josephson junction comprises a first superconductor contact, a tunnel barrier layer, and a second superconductor contact, and wherein the forming comprises:
forming the planar Josephson junction over a third crystalline silicon layer of the third wafer; and
forming the one or more capacitor pads to extend from above the third crystalline silicon layer to the second buried layer.

17. The method of claim 11, wherein the bonding the third patterned superconducting layer comprises bonding the third patterned superconducting layer to a first surface of a third crystalline silicon layer of the third wafer, the method further comprising:
forming one or more qubits on a second surface of the third crystalline silicon layer, the second surface is opposite the first surface, wherein the one or more qubits comprise a planar Josephson junction and one or more capacitor pads comprising superconducting material, the planar Josephson junction comprising a first superconductor contact, a tunnel barrier layer, and a second superconductor contact.

18. A quantum information device, comprising:
a first buried layer that comprises a first patterned superconducting layer of a first wafer bonded to a second patterned superconducting layer of a second wafer, wherein a first pattern of the first patterned superconducting layer mirrors a second pattern of the second patterned superconducting layer, and the first pattern having a matching mirrored alignment with the second pattern;
a patterned superconducting film attached to the second wafer; and
a second buried layer that comprises a third patterned superconducting layer of a third wafer bonded to the patterned superconducting film attached to the second wafer.

19. The quantum information device of claim 18, wherein the first wafer comprises a first crystalline silicon layer that is attached to the first patterned superconducting layer, wherein the second wafer comprises a second crystalline silicon layer that is attached, at a first side, to the second patterned superconducting layer, and wherein the patterned superconducting film is attached to a second side of the second crystalline silicon layer, wherein the second side is opposite the first side, and wherein the third wafer comprises a third crystalline silicon layer that is attached to the third patterned superconducting layer.

20. The quantum information device of claim 18, further comprising one or more microwave circuits in at least one of the first buried layer or the second buried layer, wherein the one or more microwave circuits are selected from a group consisting of a buried coplanar waveguide, a buried microstrip, a microstrip, and a slot line.

21. The quantum information device of claim 18, further comprising at least one qubit in the second buried layer that comprises at least one of a vertical Josephson junction or a planar Josephson junction.

22. A superconducting device, comprising:
a first buried layer that comprises a first patterned superconducting layer of a first wafer bonded to a second patterned superconducting layer attached to a first side of a second wafer wherein a first pattern of the first patterned superconducting layer mirrors a second pattern of the second patterned superconducting layer, and the first pattern having a matching mirrored alignment with the second pattern;
a second buried layer comprising a third patterned superconducting layer of a third wafer bonded to a patterned superconducting film attached to a second side of the second wafer; and
a qubit in the second buried layer, wherein the qubit comprises a planar Josephson junction and one or more capacitor pads comprising superconducting material, the planar Josephson junction comprising a first superconductor contact, a tunnel barrier layer, and a second superconductor contact.

23. A superconducting structure, comprising:
a first buried layer that comprises a first patterned superconducting layer of a first wafer bonded to a second patterned superconducting layer attached to a first side of a second wafer wherein a first pattern of the first patterned superconducting layer mirrors a second pattern of the second patterned superconducting layer, and the first pattern having a matching mirrored alignment with the second pattern;
a second buried layer that comprises a third patterned superconducting layer of a third wafer bonded to a patterned superconducting film attached to a second side of the second wafer; and
a third layer that comprises a qubit comprising a planar Josephson junction and one or more capacitor pads comprising superconducting material, the planar Josephson junction comprising a first superconductor contact, a tunnel barrier layer, and a second superconductor contact, wherein the third layer is attached to the second buried layer.

24. The superconducting structure of claim 23, wherein the planar Josephson junction is located over a crystalline silicon layer of the third wafer, and wherein the one or more capacitor pads extend from above the crystalline silicon layer to the second buried layer.

25. The superconducting structure of claim 23, wherein the third patterned superconducting layer is attached to a first surface of a crystalline silicon layer of the third wafer, the superconducting structure further comprising one or more additional qubits on a second surface of the crystalline silicon layer, the second surface is opposite the first surface.

* * * * *